United States Patent [19]

Imaizumi et al.

[11] Patent Number: 5,392,361
[45] Date of Patent: Feb. 21, 1995

[54] METHOD AND APPARATUS FOR DETECTING POSITION OF A MARK

[75] Inventors: Masaaki Imaizumi; Eiji Nishimori, both of Tokyo; Yasuteru Ichida; Naoki Ayata, both of Machida, all of Japan

[73] Assignee: Canon Kabushiki Kaisha, Tokyo, Japan

[21] Appl. No.: 137,804

[22] Filed: Oct. 19, 1993

Related U.S. Application Data

[63] Continuation of Ser. No. 888,433, May 28, 1992, abandoned, which is a continuation of Ser. No. 310,203, Feb. 14, 1989, abandoned.

[30] Foreign Application Priority Data

Feb. 15, 1988 [JP] Japan .................. 63-033483

[51] Int. Cl.⁶ .............................................. G06K 9/00
[52] U.S. Cl. .............................. 382/8; 382/14; 395/61
[58] Field of Search .................. 382/8, 14, 15, 48; 364/807, 274.6; 395/10, 21, 61, 62

[56] References Cited

U.S. PATENT DOCUMENTS

| | | | |
|---|---|---|---|
| 4,553,834 | 11/1985 | Ayata et al. | 364/490 |
| 4,634,876 | 1/1987 | Ayata et al. | 356/400 |
| 4,641,071 | 2/1987 | Tazawa et al. | 318/640 |
| 4,641,257 | 2/1987 | Ayata | 364/559 |
| 4,663,534 | 5/1987 | Ayata et al. | 356/401 |
| 4,669,867 | 6/1987 | Uda et al. | 356/400 |
| 4,688,088 | 8/1987 | Hamazaki et al. | 358/101 |
| 4,694,418 | 9/1987 | Ueno et al. | 364/513 |
| 4,713,784 | 12/1987 | Ayata | 364/559 |
| 4,719,357 | 1/1988 | Ayata et al. | 364/559 |
| 4,794,648 | 12/1988 | Ayata et al. | 382/8 |
| 4,839,823 | 6/1989 | Matsumoto | 364/513 |
| 4,860,213 | 8/1989 | Bonissone | 364/513 |
| 4,864,490 | 9/1989 | Nomoto et al. | 364/513 |
| 4,989,082 | 1/1991 | Hopkins | 382/8 |
| 5,014,330 | 5/1991 | Kobayashi et al. | 382/8 |
| 5,018,219 | 5/1991 | Matsuzaki et al. | 382/8 |
| 5,023,917 | 6/1991 | Bosc et al. | 382/8 |
| 5,027,295 | 6/1991 | Yotsuya | 382/8 |
| 5,163,102 | 1/1992 | Yamazaki et al. | 382/8 |

*Primary Examiner*—Joseph Mancuso
*Attorney, Agent, or Firm*—Fitzpatrick, Cella, Harper & Scinto

[57] ABSTRACT

A mark position detecting method and apparatus, suitably usable in a semiconductor device manufacturing exposure apparatus, called a stepper, prints images of a pattern of a reticle upon different shot areas on a semiconductor wafer, and aligns the reticle and the wafer. In this method, fuzzy reasoning is made by using, for example, a membership function which empirically represents the relationship between a mark signal and an alignment result. By using a conclusion of the fuzzy reasoning, the position of the mark is detected. Thus, the alignment accuracy can be improved significantly.

63 Claims, 29 Drawing Sheets

FIG. 7(A) NB
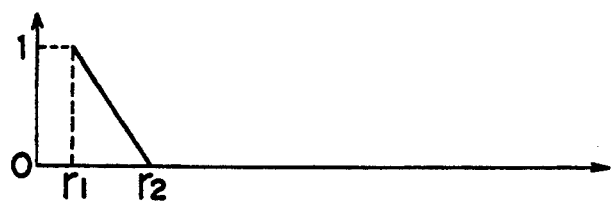
FIG. 7(B) NM
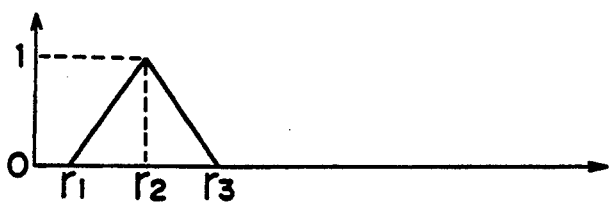
FIG. 7(C) NS
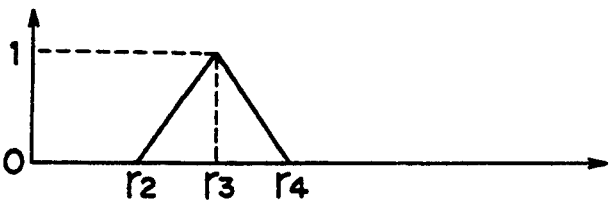
FIG. 7(D) ZE
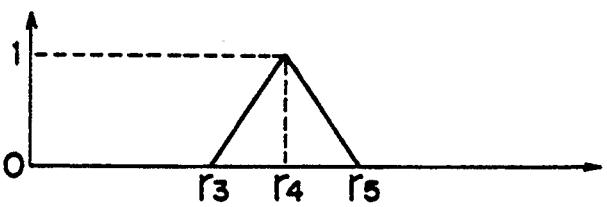
FIG. 7(E) PS
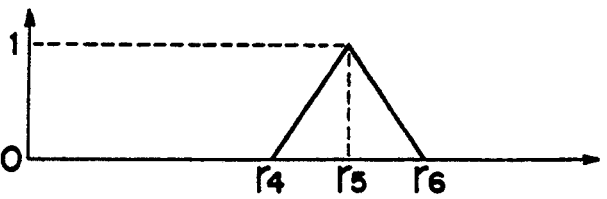
FIG. 7(F) PM
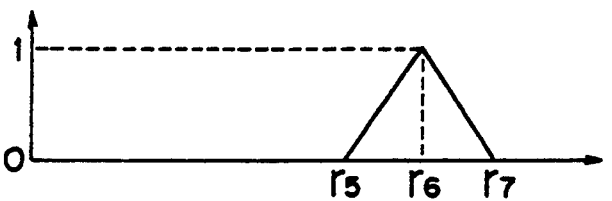
FIG. 7(G) PB
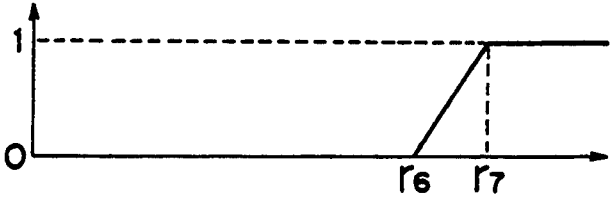

FIG. 8(A) NB
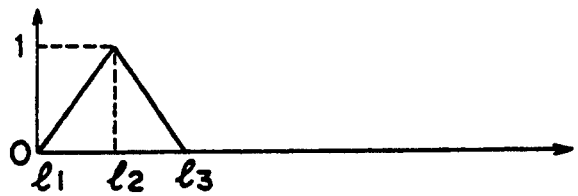
FIG. 8(B) NM
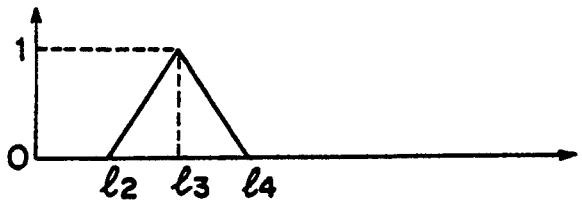
FIG. 8(C) NS
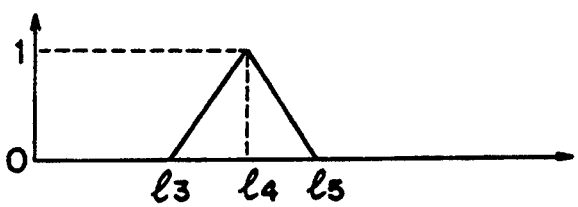
FIG. 8(D) ZE
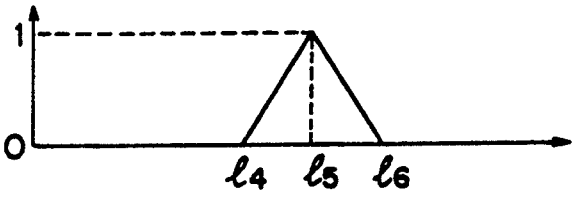
FIG. 8(E) PS
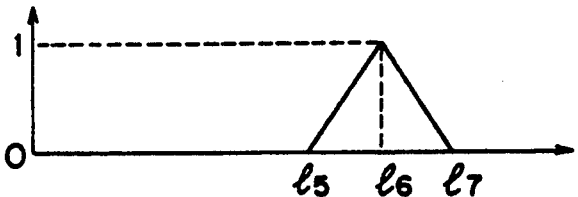
FIG. 8(F) PM
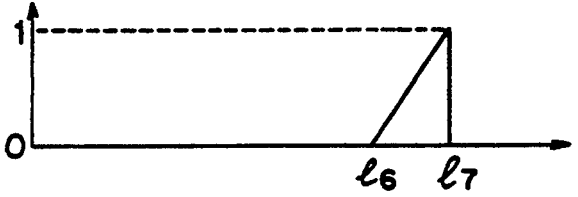
FIG. 8(G) PB R is PS $\Delta l$ is PS R is ZE $\Delta l$ is ZE

Y-DOWN MEMBERSHIP FUNCTION

Y-CENTER MEMBERSHIP FUNCTION

Y-UP MEMBERSHIP FUNCTION

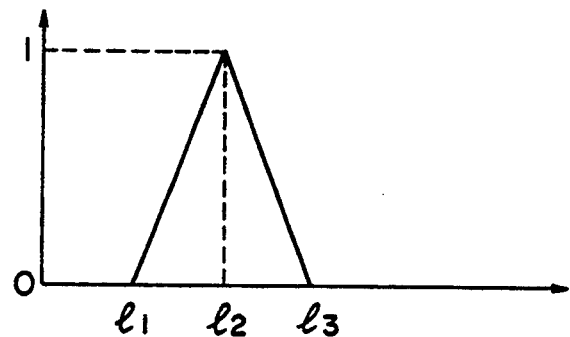
FIG.13(A) SM
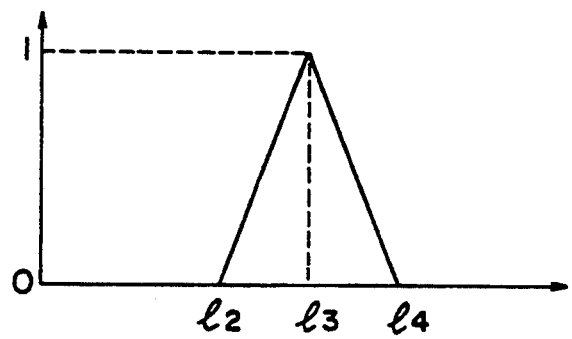
FIG.13(B) MD
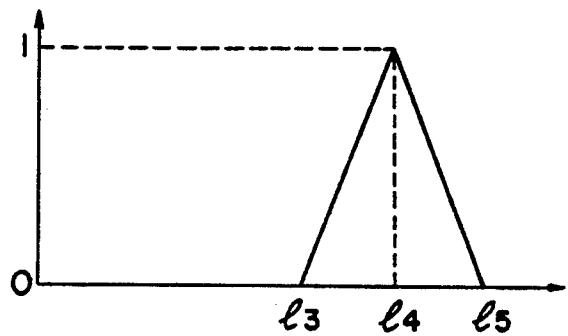
FIG.13(C) LA

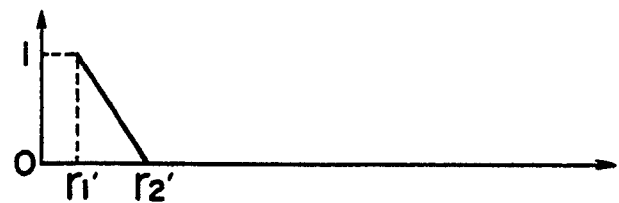
FIG.14(A) NB
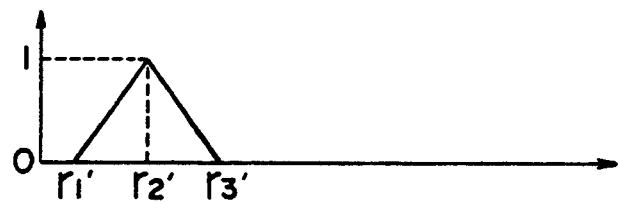
FIG.14(B) NM
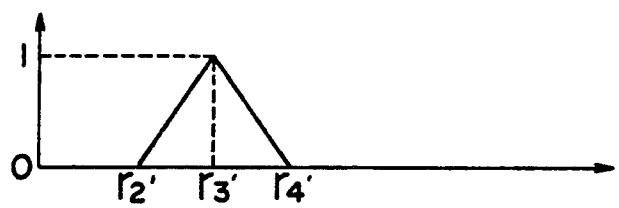
FIG.14(C) NS
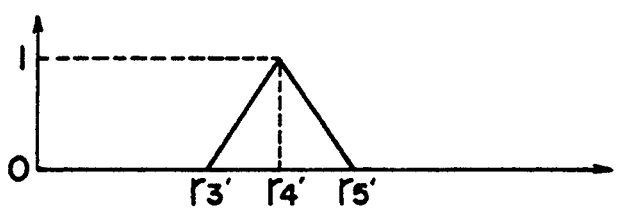
FIG.14(D) ZE
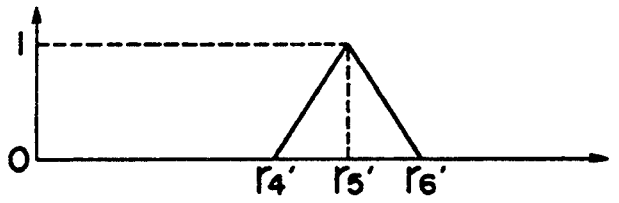
FIG.14(E) PS
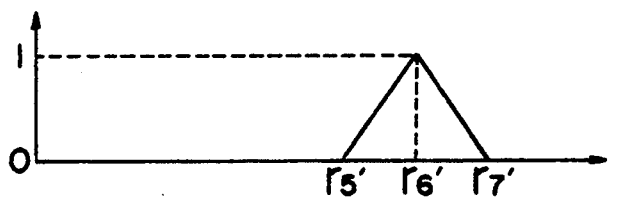
FIG.14(F) PM
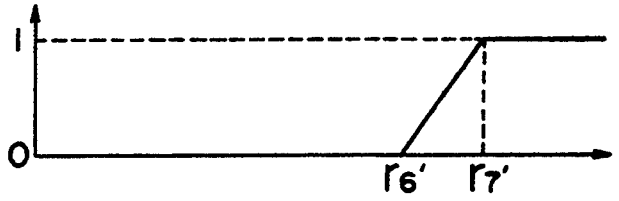
FIG.14(G) PB FIG.15(A) NS 
FIG.15(B) NM 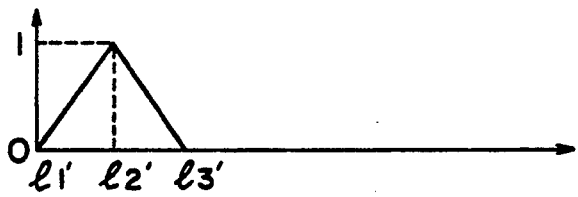
FIG.15(C) NS 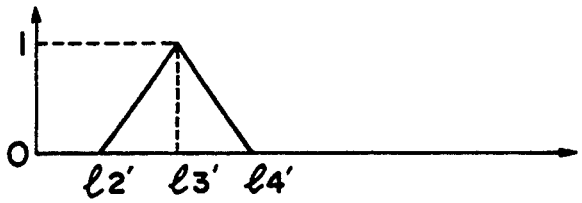
FIG.15(D) ZE 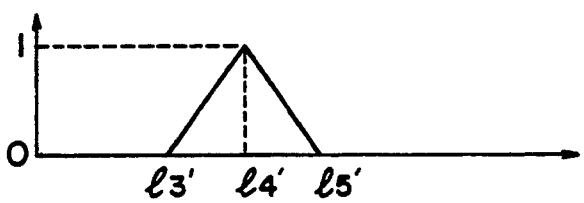
FIG.15(E) PS 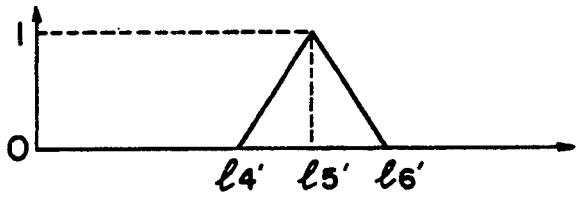
FIG.15(F) PM 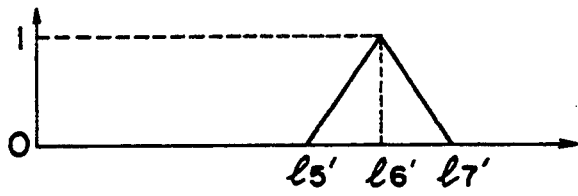
FIG.15(G) PB 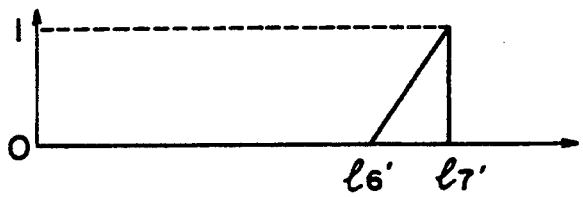

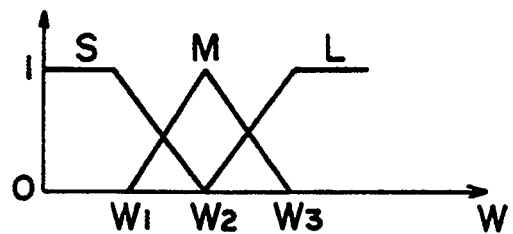
FIG.16(A)
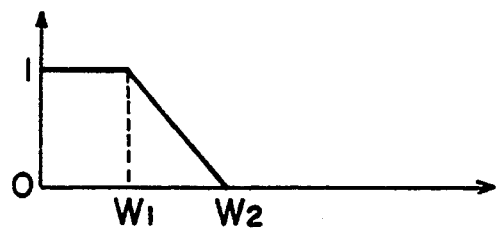
FIG.16(B) S
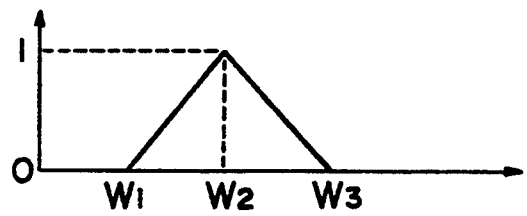
FIG.16(C) M
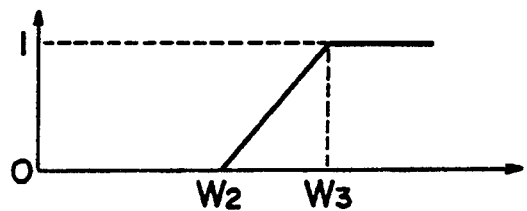
FIG.16(D) L FIG.17(B) S 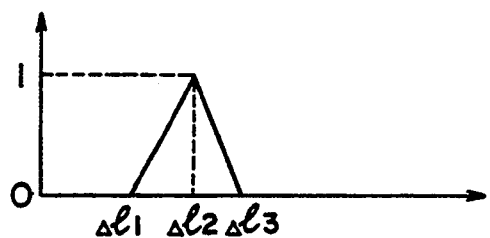
FIG.17(C) M 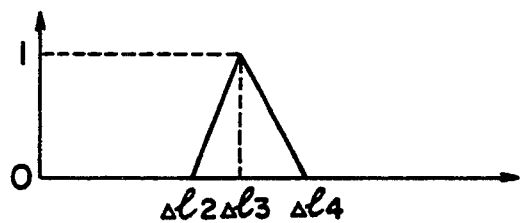
FIG.17(D) L 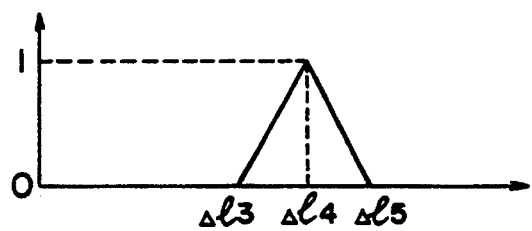

FIG.18(B) NE 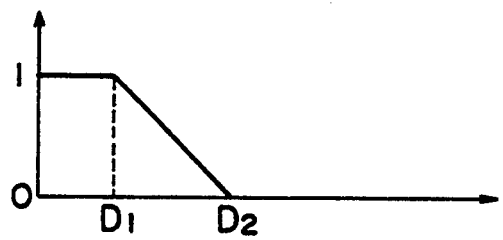
FIG.18(C) ZE 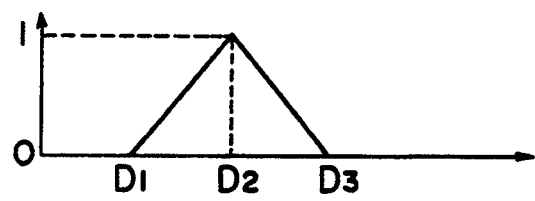
FIG.18(D) PO 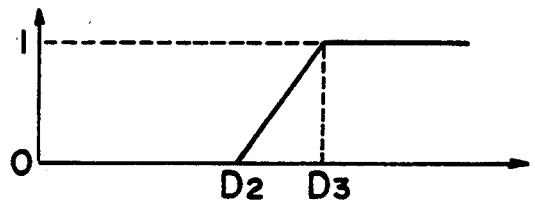

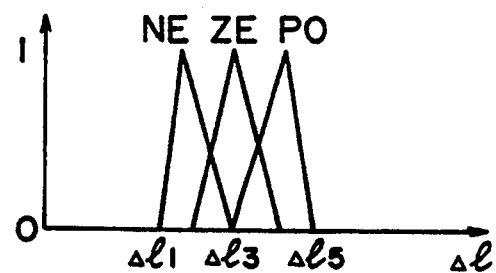
FIG. 19(A)
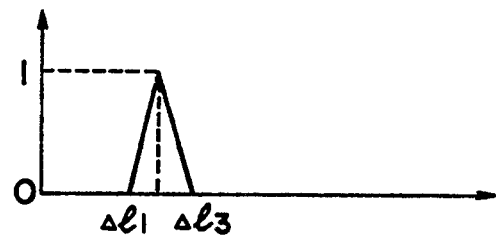
FIG. 19(B) NE
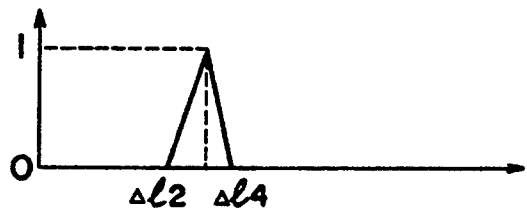
FIG. 19(C) ZE
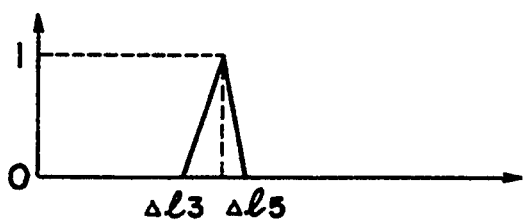
FIG. 19(D) PO

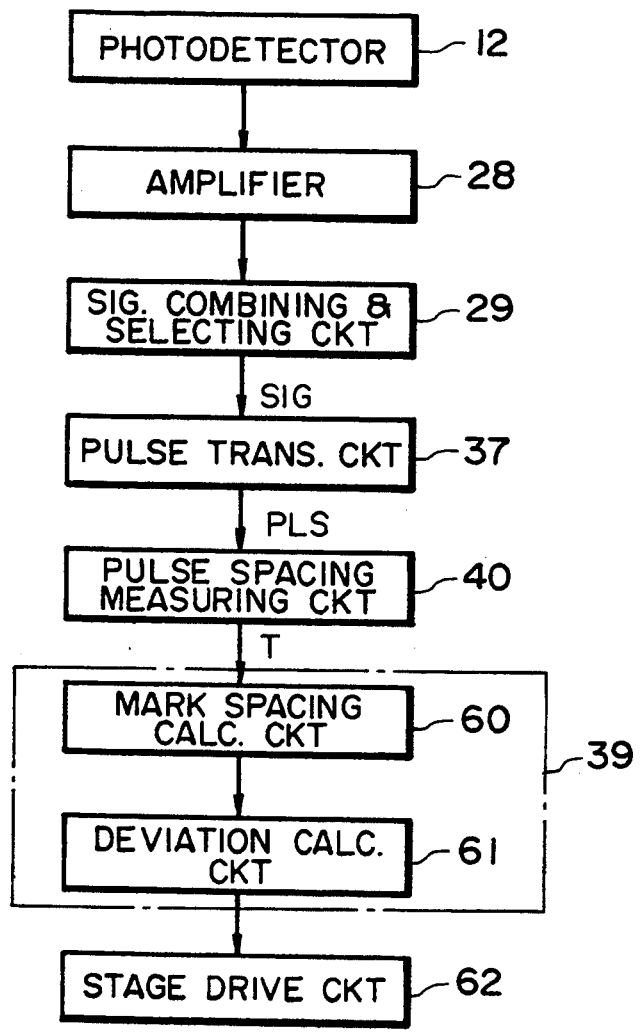
F I G. 26

METHOD AND APPARATUS FOR DETECTING POSITION OF A MARK

This application is a continuation of application Ser. No. 07/888,433, filed May 28, 1992, now abandoned, which is a continuation of application Ser. No. 07/310,203, filed Feb. 14, 1989, now abandoned.

FIELD OF THE INVENTION AND RELATED ART

This invention relates to a method and apparatus for detecting the position of a mark and, more particularly, to such a method and apparatus of the type that a light is projected upon an alignment mark provided on a wafer and the light reflected by the alignment mark is photoelectrically converted by a photodetector to detect the position of the alignment mark on the basis of a signal of a predetermined waveform obtained by the photoelectric conversion.

In the field of semiconductor device manufacturing exposure apparatuses, it is well-known that the mask-to-wafer alignment is a very important technical problem.

SUMMARY OF THE INVENTION

It is an object of the present invention to provide a method and apparatus for detecting the position of a mark constantly with high precision.

In accordance with one aspect of the present invention, to achieve this object, there is provided a method and apparatus for detecting the position of a mark on the basis of a signal obtained by photoelectric conversion of light from the mark, wherein fuzzy reasoning using a membership function or functions which represent, according to an empirical rule, the relationship in tendency between a signal obtained by the photoelectric conversion (and/or a different signal) and the detection of the mark position, the result of fuzzy reasoning being used for the mark position detection based on a signal produced by the photoelectric conversion.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7, (A)–(G), and FIG. 8, (A)–(G), are representations illustrating membership functions usable in the first embodiment.

FIG. 14, (A)–(G), and FIG. 15, (A)–(G), are explanatory views, respectively, illustrating membership functions usable in the method according to the fourth embodiment of the present invention.

FIG. 16, (A)–(D), and FIG. 17, (A)–(D), are representations illustrating membership functions usable in the method according to a fifth embodiment of the present invention.

FIG. 26 is a block diagram of a signal processing system usable in the alignment system shown in FIG. 24.

DESCRIPTION OF THE PREFERRED EMBODIMENTS

Figure 24:
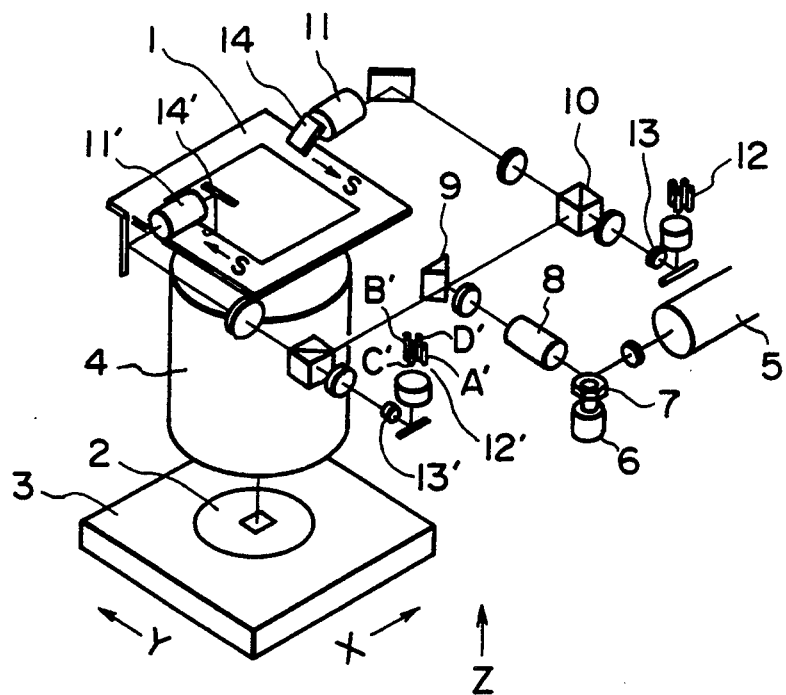
FIG. 24 is a schematic and perspective view showing the arrangement of an alignment system employed in an exposure apparatus, to which the present invention is applicable.

Referring first to FIG. 24, there is shown an example of an alignment system used in an exposure apparatus to which the present invention is applicable, wherein the exposure apparatus is of the type, called a stepper, that images of a circuit pattern of a mask are printed on different short areas on a wafer, in sequence, through a reduction projection optical system.

In FIG. 24, denoted at 1 is a mask (or reticle) having formed thereon an integrated circuit pattern and one or more alignment marks provided around the circuit pattern. The mask 1 is held by a movable mask stage, not shown. Denoted at 4 is a reduction projection lens system, and denoted at 2 is a wafer whose surface is coated with a photosensitive material. The wafer is provided with one or more wafer alignment marks which are to be used for alignment with the alignment marks of the mask 1. Movable wafer stage 3 is provided which is adapted to hold the wafer 2 thereon. Each of the mask stage and the wafer stage 3 is movable in each of an X direction, a Y direction and a rotational ($\theta$) direction about a Z axis. In operation, by displacing the mask stage and/or the wafer stage 3 in the X, Y and $\theta$ directions, the alignment is executed.

Denoted at 7 is a polygonal mirror which is rotatable by means of a motor 6. A laser beam emanating from a laser light source 5 is directed to a reflection surface of the polygonal mirror 7. Denoted at 8 is an f-$\theta$ lens, and denoted at 9 is a roof prism whose apex is disposed on an optical axis of the f-$\theta$ lens 8. As a result, the laser beam reflected by the reflection surface of the polygonal mirror 7 passes the f-$\theta$ lens 8 and reaches the apex of the roof prism 9. Thus, each scanning deflection (one scan) of the laser beam by the polygonal mirror 7 is divided into first and second halves in which the laser beam is directed rightwardly and leftwardly, respectively.

Denoted at 10 and 10' are beam splitters; denoted at 11 and 11' are objective lenses; denoted at 14 and 14' are objective mirrors; and denoted at 13 and 13' are stoppers. Reference characters 12A, 12B, 12C, 12D, 12A', 12B', 12C' and 12D' denote photodetectors.

It is seen in FIG. 24 that the illustrated signal detecting system comprises left and right systems of symmetric structure. In this specification, the system which is on the right hand side as viewed from the polygonal mirror 7 side will be referred to as a "right-hand signal detecting system", while the system which is on the left hand side will be referred to as a "left-hand signal detecting system". Those components of the left-hand signal detecting system similar to or corresponding to the members used in the right-hand signal detecting system are denoted by the same reference numerals with primes.

The laser beams separately directed by the roof prism 9 toward the left-hand and right-hand signal detecting systems are projected upon left and right alignment marks of the mask 1 as well as left and right alignment marks formed in a certain shot area on the wafer 2, such that with the rotation of the polygonal mirror 7 these alignment marks are scanned with the laser beams along an arrow S.

Figure 25:
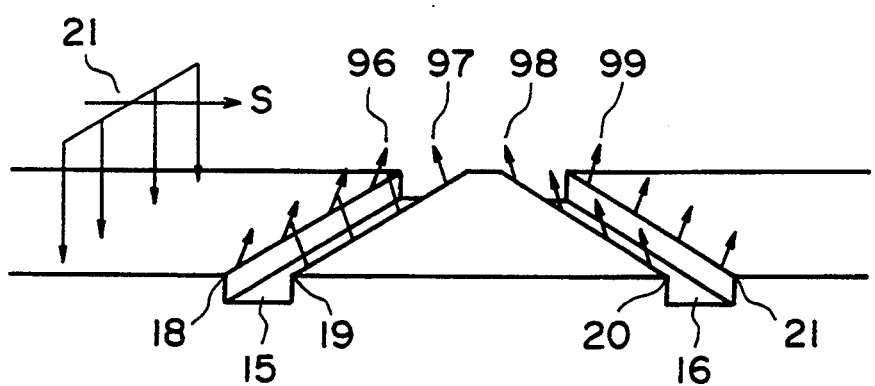
FIG. 25 is a schematic view illustrating an example of an alignment mark provided on a wafer and the manner of formation of diffraction light at the alignment mark of this example.

FIG. 25 is a schematic view which exemplifies alignment marks provided on a wafer 2 as well as the manner of formation of diffraction light at these alignment marks. In the FIG. 25 example, the lengthwise directions of the alignment marks 15 and 16 are orthogonal to each other. To these alignment marks a laser beam is scanningly deflected in the direction as depicted by an arrow S.

When the laser beam scans the alignment marks 15 and 16, there are produced diffraction lights at edge 18, 19, 20 and 21 of recessed portions of the alignment marks 15 and 16, which diffraction lights are emitted in the directions as depicted by arrows 96, 97, 98 and 99.

The diffraction lights from the alignment marks of the wafer 2 and the mask 1 impinge upon signal detecting system stoppers 13 and 13' shown in FIG. 24.

At this time, by selectively and sequentially picking up, in a timed relationship with the laser beam scan, those signals from the photodetectors 12A, 12B, 12C and 12D (FIG. 24), which are provided in respective relations with the directions as depicted by arrows 96, 97, 98 and 99, in an order of 12A, 12B, 12C and 12D, it may be possible to obtain alignment signals of good signal-to-noise ratio.

By processing the thus obtained alignment signals in such a sequence as depicted in the block diagram of FIG. 26, the positions of the alignment marks 15 and 16 may be detected correctly. Then, the relative position of the mask 1 and the wafer 2 is adjusted.

Figure 27:
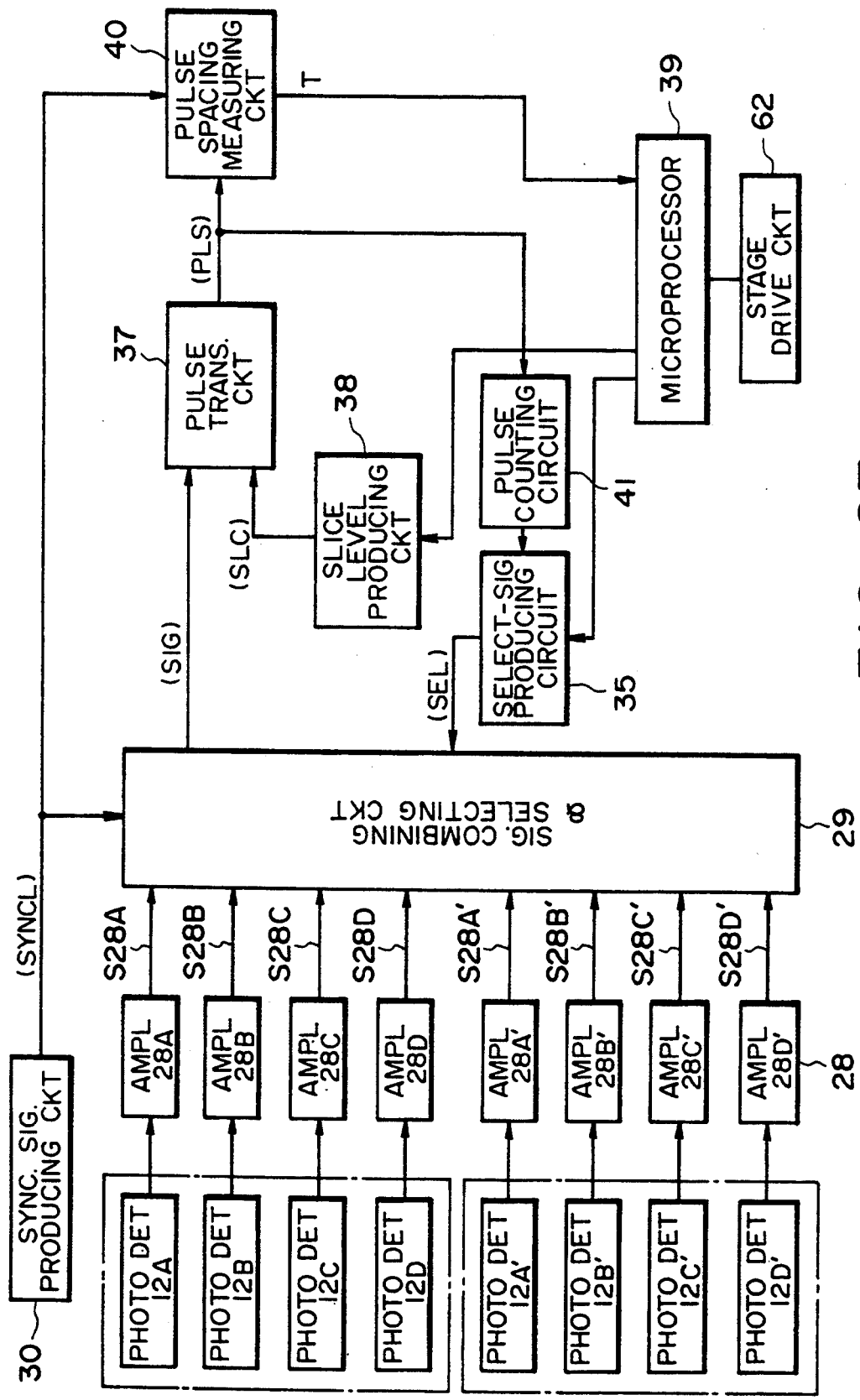
FIG. 27 is a block diagram showing details of electric circuits included in a portion of the signal processing system shown in FIG. 26.

FIG. 27 is a block diagram of a signal processing system which is arranged to detect positional information from the waveforms of the signals obtained as a result of photoelectric conversion at the photodetectors 12A–12D.

More specifically, the block diagram of FIG. 27 illustrates details of the photodetector 12, amplifier 28, signal combining and selected circuit 29 and pulse transformation circuit 37 shown in FIG. 26. In FIG. 27, photodetector groups (12A, 12B, 12C and 12D) and (12A', 12B', 12C' and 12D') correspond to a group of photodetectors of the right-hand detecting system and a group of photodetectors of the left-hand detecting system, which are denoted at the same reference numerals in FIG. 24.

Output signals of these photodetector groups 12 are applied to an amplifier group 28 comprising amplifiers 28A, 28B, 28C, 28D, 28A', 28B', 28C' and 28D', and are amplified by the amplifier group 28, so that they are transformed into an output signal group S28 (S28A, S28B, S28C, S28D, S28A', S28B', S28C' and S28D') which are subsequently applied to the signal combining and selecting circuit 29.

The signal combining and selecting circuit 29 is controlled by an output signal SYNCL of a synchronization signal producing circuit 30 as well as an output signal SEL of a select signal producing circuit 36.

Figure 28:
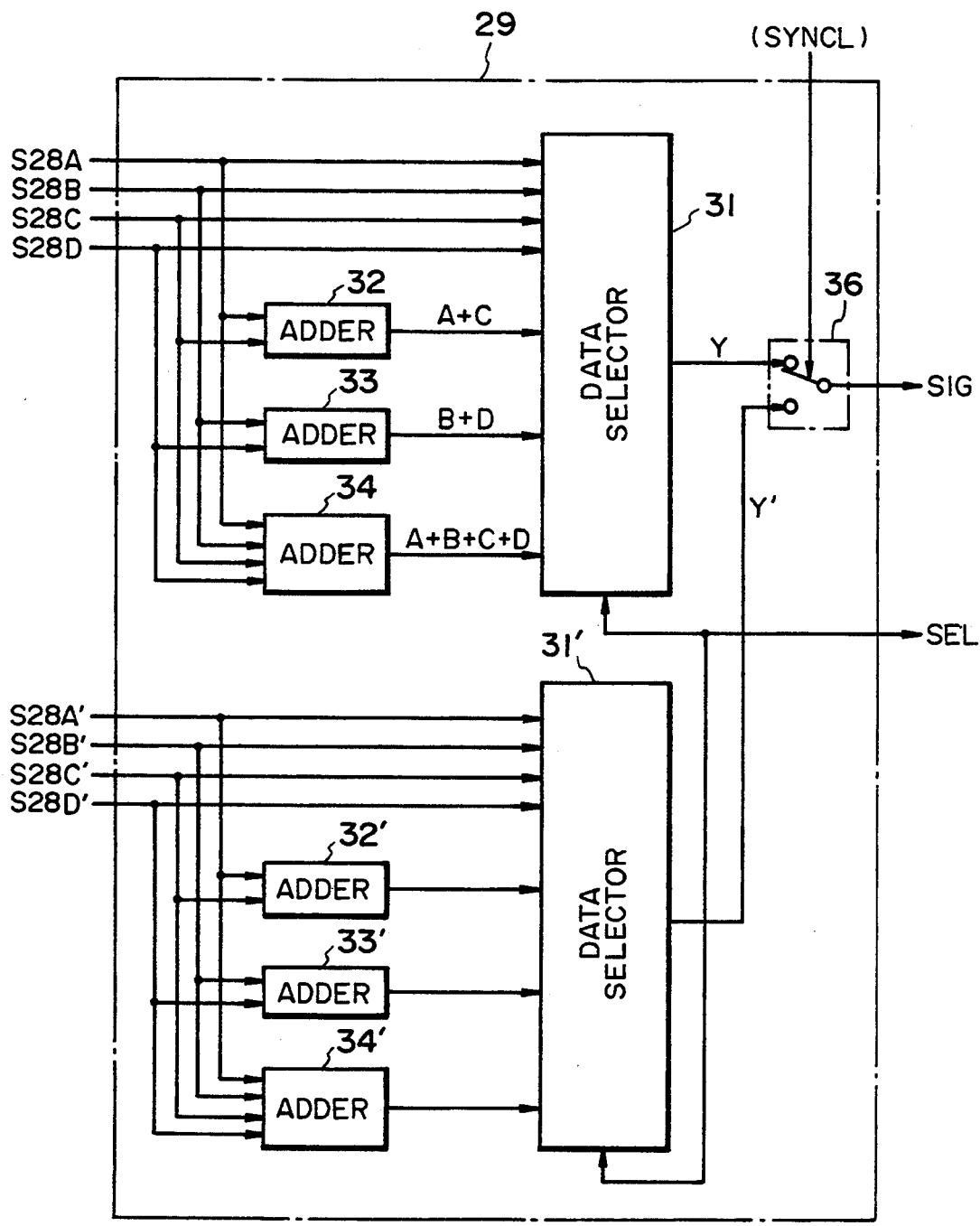
FIG. 28 is a block diagram showing the structure of a signal combining and selecting circuit.

FIG. 28 is a block diagram showing details of the signal combining and selecting circuit 29.

In FIG. 28, the output signal group (S28A, S28B, S28C and S28D) from the right-hand signal detecting system shown in FIG. 24 are applied directly to a data selector 31. On the other hand, signal addition is made at each of an adder 32 for executing analog addition of the signals S28A and S28C; an adder 33 for executing analog addition of the signals S28B and S28D; and an adder 34 for executing analog addition of the signals S28A, S28B, S28C and S28D. The combined signals from these adders are applied to the data selector 31.

The data selector 31 is provided by a selector of seven-input and one-selection type, in this example, such that the signal selection is made in response to a select signal SEL from the select signal producing circuit 35. Output line Y of the data selector 31 is connected to one input terminal of an analog switch 36.

On the other hand, those signals of the left-hand signal detecting system (FIG. 24) are processed in a similar manner as the signals of the right-hand signal detecting system (as described, the components of the left-hand signal detecting system as corresponding to those of the right-hand signal detecting system are denoted by the same reference numerals with primes in FIG. 24).

Output line Y' of a data selector 31' of the left-hand signal detecting system is coupled to the other input terminal of the analog switch 36.

The analog switch 36 selects one of the output lines Y and Y' in response to a synchronizing signal SYNCL from the synchronizing signal producing circuit 30.

FIG. 29 is a schematic representation for explicating, in terms of signal waveforms, the signal processing flow to be made in the signal processing circuit of the FIG. 26 example (i.e., the flow from a photodetector 12 to a pulse spacing measuring circuit 40).

In FIG. 29, reference numerals 101, 102, 103, 104, 105, 106, 107 and 108 denote alignment marks formed on a wafer 2. Reference numerals 201, 202, 203 and 204 denote alignment marks formed on a mask 1.

In FIG. 29, signal group (S101', S101", S102', S102", S103', S103", S104', S104", S105', S105", S106', S106", S107', S107", S108', S108", S201', S201", S202', S202", S203', S203", S204' and S204") depict details of output signal group (S28A, S28B, S28C, S28D, S28A', S28B', S28C' and S28D') of the amplifier group 28 (FIG. 27) obtainable from the alignment mark group (101, 102, 103, 104, 105, 106, 107, 108, 201, 202, 203 and 204).

Alignment signal SiG as illustrated in part (B) of FIG. 29 is such a signal waveform produced by passing the output signal group (S28A, S28B, S28C, S28D, S28A', S28B', S28C' and S28D') of the amplifier group 28 through the adder group (32, 32', 33 and 33') as well as the data selector 31.

The signal group (S101, S102, S103, S104, S105, S106, S107, S108, S201, S202, S203 and S204) is produced by executing the adding operation in regard to the signal group (S101', S101", S102', S102", S103', S103", S104', S104", S105', S105", S106', S106", S107', S107", S108', S108", S201', S201", S202', S202", S203', S203", S204' and S204").

Referring back to FIG. 27, the pulse transformation circuit 37 is a circuit adapted to compare an output signal SiG of the signal combining and selecting circuit 29 with an output voltage SLC of a slice level producing circuit 38. The slice level producing circuit 38 is adapted to execute digital-to-analog conversion to convert a digital data supplied from a microprocessor 39 into an analog data, and to produce a slice voltage SLC for the alignment signal SiG. The pulse transformation circuit 37 is adapted to execute voltage comparison between an alignment signal SiG and a slice voltage SLC, and to binarize (binary-code) the alignment signal SiG to thereby provide a binary-coded signal such as a PLS signal illustrated in part (C) of FIG. 29, for example.

Pulse signals PLS which are output signals of the pulse transformation circuit 37 (FIG. 27) are applied to the pulse spacing measuring circuit 40. This pulse spacing measuring circuit 40 is adapted to count, in terms of reference clocks provided therein, the spacing of the pulse signals PLS while using, as a start timing, a synchronizing signal SYNCL as outputted from the synchronizing signal producing circuit 30.

Explaining this particularly with reference to part (C) of FIG. 29, the spacing measuring circuit 40 measures a rise time and fall time group T (T101R, T101F, T201R, T201F, T102R, T102F, T103R, T103F, T202R, T202F, T104R, T104F, T105R, T105F, T203R, T203F, T106R, T106F, T107R, T107F, T204R, T204F, T108R and T108F) of the alignment mark signal SiG group (S101, S201, S102, S103, S202, S104, S105, S203, S106, S107, S204 and S108), from the rise of a synchronizing signal SYNCL, and the measured time group T is stored within the measuring circuit 40 as a data group T.

In part (A) of FIG. 29, the interval between the alignment marks 101 and 201 is denoted by W1L; the interval between the alignment marks 201 and 102 is denoted by W2L; the interval between the alignment marks 102 and 103 is denoted by W3L; the interval between the alignment marks 103 and 202 is denoted by W4L; and the interval between the alignment marks 202 and 104 is denoted by W5L.

Similarly, the interval between the alignment marks 105 and 203 is denoted by W1R; the interval between the alignment marks 203 and 204 is denoted by W2R; the interval between the alignment marks 106 and 107 is denoted by W3R; the interval between the alignment marks 107 and 204 is denoted by W4R; and the interval between the alignment marks 204 and 108 is denoted by W5R.

The microprocessor 39 of the FIG. 27 example functions also as a mark spacing calculating circuit 60 (FIG. 26) for calculating the above-described intervals as well as a deviation calculating circuit 61 for calculating any deviation between a mask 1 and a wafer 2. More particularly, it is adapted to calculate an interval between adjacent mask alignment mark and wafer alignment mark by using the data group T having been stored in the pulse spacing measuring circuit 40 (FIG. 27). Namely, the microprocessor 39 can function to calculate the intervals W1L, W2L, W4L, W5L, W1R, W2R, W4R and W5R as depicted in FIG. 29.

For example, the interval W1L between the alignment marks 101 and 201 shown in FIG. 29 can be calculated within the microprocessor 39 of the FIG. 27, in the following manner:

$$W1L = [(T101R + T101F)/2] - [(201R + T201F)/2]$$

From the intervals W1L, W2L, W4L, W5L, W1R, W2R, W4R and W5R as calculated in the described manner, it is possible to directly calculate the amount of deviation between the wafer alignment mark and mask alignment mark.

Upon completion of the calculation of the mask-to-wafer deviation in the described manner, the X-Y stage 3 shown in FIG. 24 and/or the unshown mask stage is driven by means of a stage driving circuit 62 so as to correct the calculated deviation, whereby the mask-to-wafer alignment is executed.

However, it is possible that a wafer which is going to be subjected to the mark position detection contains distortion such as expansion, contraction, warp, etc., caused as a result of thermal hysteresis of a preceding wafer process, for example. As a consequence or, alternatively, for any other factor or factors, there is a possibility that an alignment signal such as depicted at SiG in part (A) of FIG. 29 is distorted. If such distortion occurs, a resultant pulse signal such as depicted at PLS in part (B) of FIG. 29 does not correctly represent the mark position. Therefore, in that case, the precision of alignment in regard to a wafer alignment mark and a mask alignment mark decreases disadvantageously.

This will be explained in greater detail, with reference to FIG. 30. FIG. 30 is a waveform view which exemplifies, in detail, an alignment signal group SiG (S101, S201 and S102) corresponding to alignment marks 101, 201 and 102 shown in FIG. 29.

Alignment signal S101 is a signal which is obtainable by analog addition of a signal S101' and a signal S101".

Similarly, alignment S201 is a signal which is obtainable by analog addition of a signal S201' and a signal S201". Also, alignment signal S102 is a signal which is obtainable by analog addition of a signal S102' and a signal S102".

Slice voltage SLC to the alignment signal 101 is denoted at SLC101. Similarly, the voltages to the signals S201 and S102 are denoted at SLC201 and SLC102, respectively.

The points of intersection of the alignment signal S101 with the slice voltage SLC 101 are denoted at T101R and T101F. Similarly, the points of intersection of the alignment signal S201 and the slice voltage SLC201 are denoted at T201R and T201F, while the points of intersection of the alignment signal S102 with the slice voltage SLC102 are denoted at T102R and T102F.

Where the signals S101' and S101", constituting the alignment signal S101, are asymmetric as illustrated in FIG. 30, the points T101R and T101F as determined by the alignment signal S101 and the slice voltage SLC101 do not correctly represent the position of the alignment mark 101 (FIG. 29).

Similarly, the points T102R and T102F as determined by the alignment signal S102 and the slice voltage SLC102 do not correctly represent the position of the alignment mark 102 (FIG. 29).

Similarly, the points T103R, T103F, T104R, T104F, T105R, T105F, T106R, T106F, T107R, T107F, T108R and T108F, corresponding to the wafer alignment mark group (103, 104, 105, 106, 107 and 108) shown in FIG. 29, do not correctly represent the positions of the members of the alignment mark group (103-108).

As a result, the accuracy of the mask-to-wafer alignment using wafer alignment marks and mask alignment marks decreases.

Such inconveniences can be avoided by the present invention.

Figure 1:
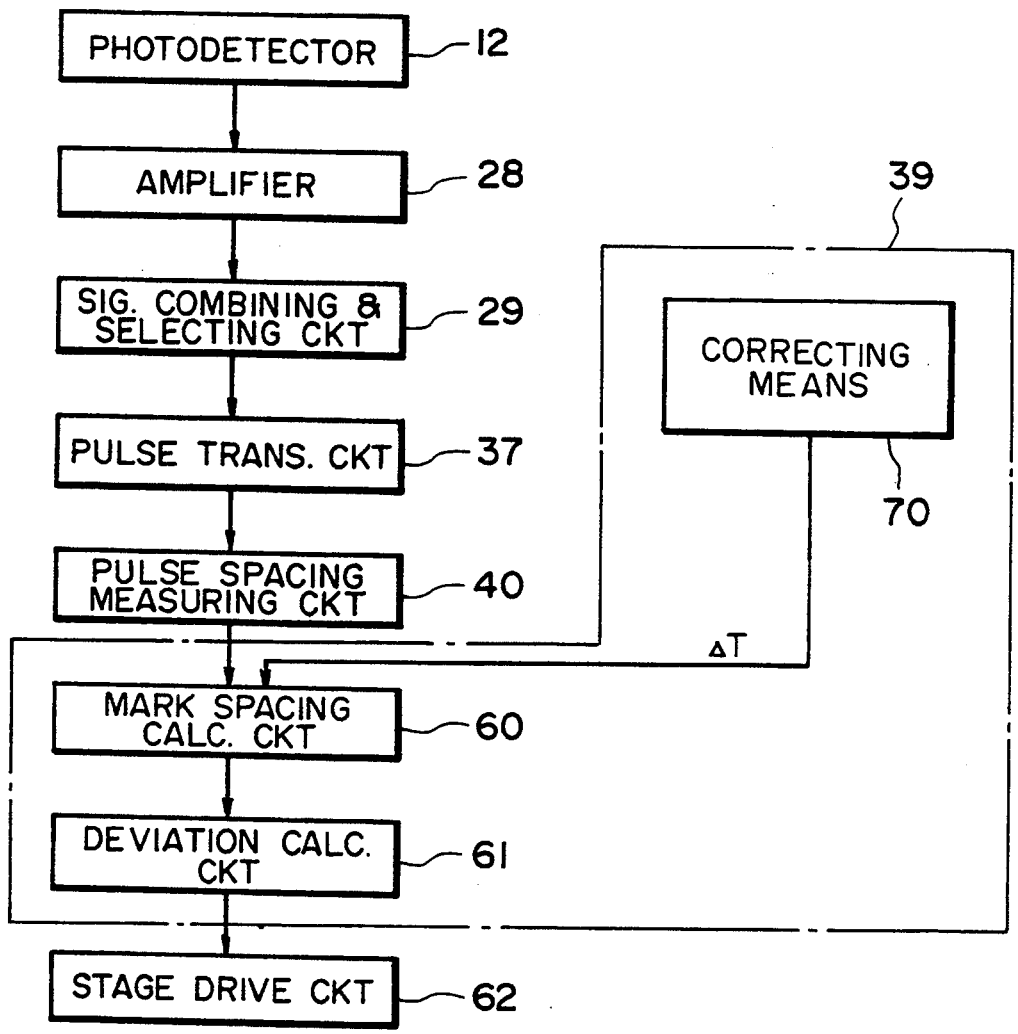
FIG. 1 is a block diagram of a system adapted to execute the mark position detection in a manner based on one important feature of the present invention.

Referring now to FIG. 1 which is a block diagram of a mark position detecting system, which is indicative of one important feature of the present invention, the portion which includes a photodetector 12, amplifier 28, pulse transformation circuit 37, pulse spacing measuring circuit 40, mark spacing calculating circuit 60, wafer-to-mask deviation calculating circuit 61 and stage driving circuit 62, may be of the same structure as of the corresponding portion of the FIG. 27 example.

Briefly, in accordance with an important feature of the present invention, a correcting means 70 is added to the processing circuit described above, to correct data (mark position) obtainable at the pulse spacing measuring circuit 40. This correction is made to ensure correct mark position detection.

In some embodiments which will be described below, like the mark spacing calculating circuit 60 and the deviation calculating circuit 61, the correcting means 70 is provided as a part of the processing function of a microprocessor generally denoted at 39 in FIG. 1. However, the invention is not so limited, but it may be provided within the FIG. 26 device as a processing circuit separate from the microprocessor 39. Alternatively, only a portion of such a correcting means may be provided as a structure separate from the microprocessor 39.

Figure 6:
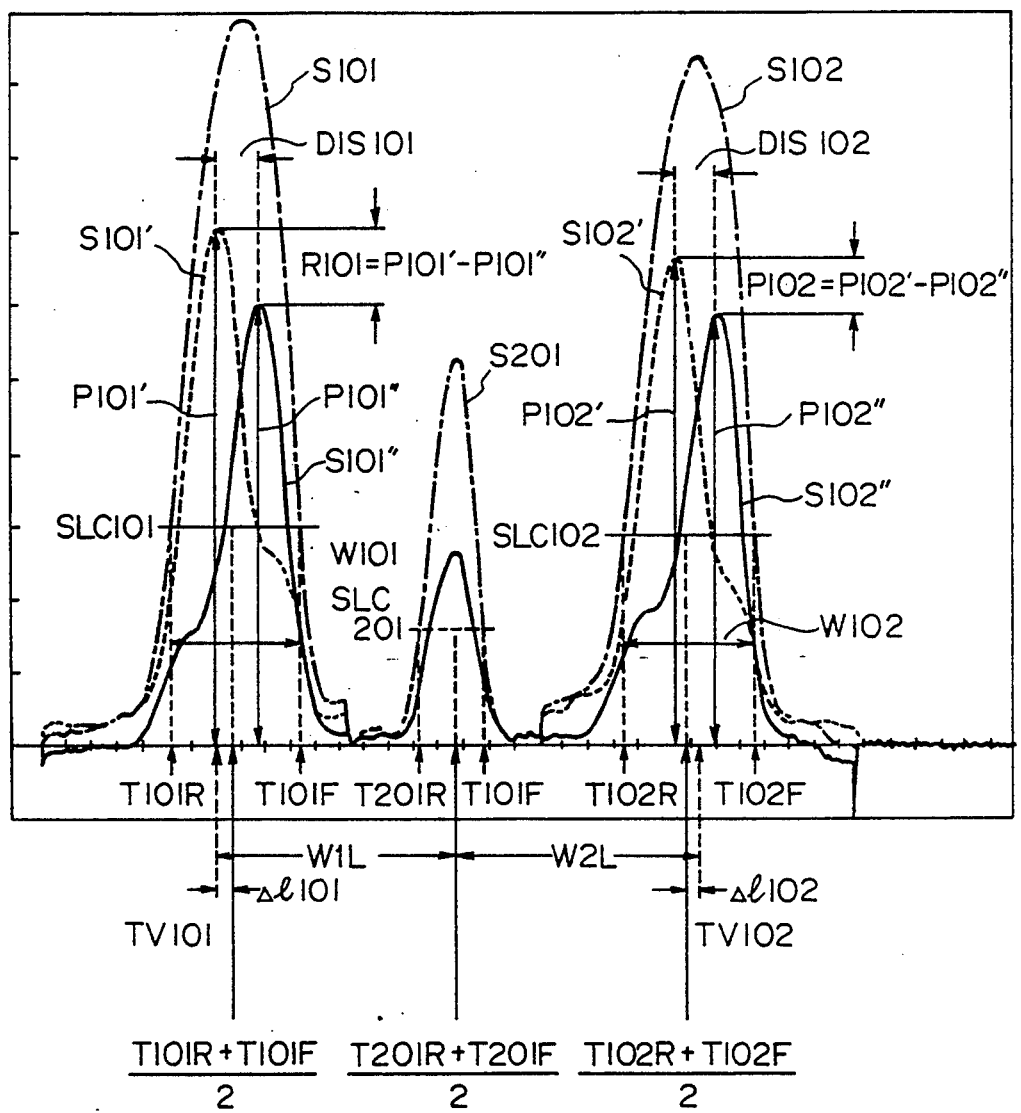
FIG. 6 is an explanatory view illustrating grouped output signals obtained from grouped alignment signals and grouped amplifiers.
Figure 9A:
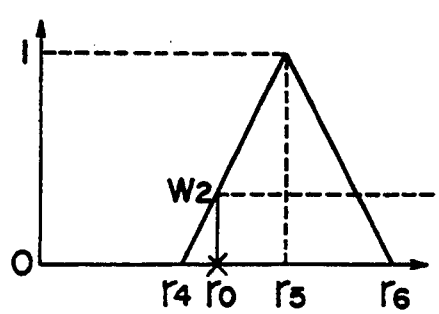
FIG. 9, (A)–(E), is an explanatory view illustrating the manner of fuzzy reasoning usable in the method of the first embodiment.
Figure 9B:
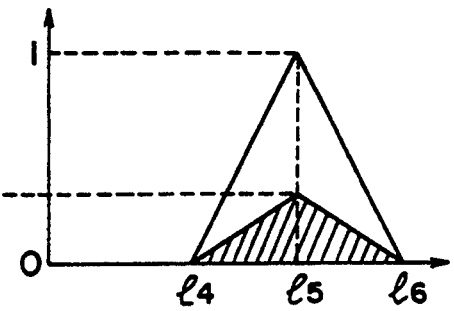
Figure 9C:
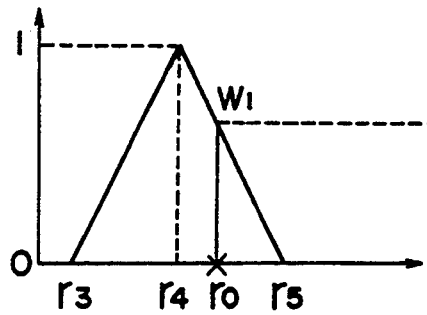
Figure 9D:
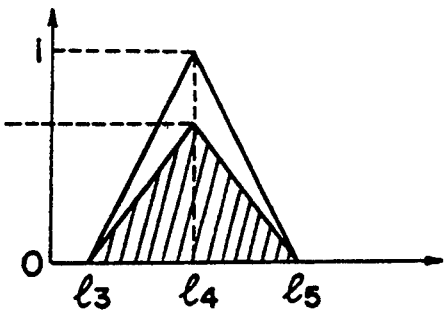
Figure 9E:
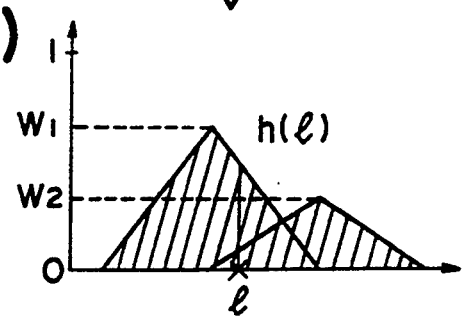

FIG. 6 is a waveform view explicating details of an alignment signal group SiG (S101, S201 and S102) supplied from the signal combining and selecting circuit 29 in relation to the alignment marks 101, 201 and 102 shown in part (A) of FIG. 29, as well as an output signal group (S101', S201', S102', S101", S201" and S102") from the amplifier group 28.

In FIG. 6, denoted at P101' is a peak value of the output signal S101'; denoted at P101" is a peak value of the output signal S101 "; denoted at P102' is a peak value of the output signal S102'; and denoted at P102" is a peak value of the output signal S102".

Similarly, a peak value group (P104', P104", P105', P105", P106', P106", P107', P107", P108' and P108") shown in part (A) of FIG. 29 corresponds to an output signal group (S104', S104", S105', S105", S106', S106", S107', S107", S108' and S108") from the amplifier group 28 shown in FIG. 27.

The wave height difference R101 as illustrated in FIG. 6 corresponds to a difference in peak value between the output signals S101' and S101", and it can be expressed as follows:

$$R101 = P101' - P101'$$

Also, wave height difference R102 between the output signals S102' and S102" can be expressed as follows:

$$R102 = P102' - P102''$$

Similarly, wave height differences R103, R104, R105, R106, R107 and R108 can be given by the following equations:

$$R103 = P103' - P103''$$

$$R104 = P104' - P104''$$

$$R105 = P105'' - P105''$$

$$R106 = P106'' - P106''$$

$$R107 = P107'' - P107''$$

$$R108 = P108'' - P108''$$

Denoted at Δl101 and Δl102 in FIG. 6 each is a slip (unshown or conceals error) which corresponds to a deviation or difference of the position of a wafer alignment mark (wafer position) to a mask alignment mark, as determined by the signal processing made in the FIG. 26 arrangement, with respect to the true wafer position.

Empirically the inventors of the subject application have found that there is an interrelation between such a slip Δl and a wave height difference R.

In a first embodiment of the present invention, such a wave height difference R is used as a characteristic parameter in fuzzy reasoning to determine, by this fuzzy reasoning, the amount of correction corresponding to that slip Δl.

Figure 2:
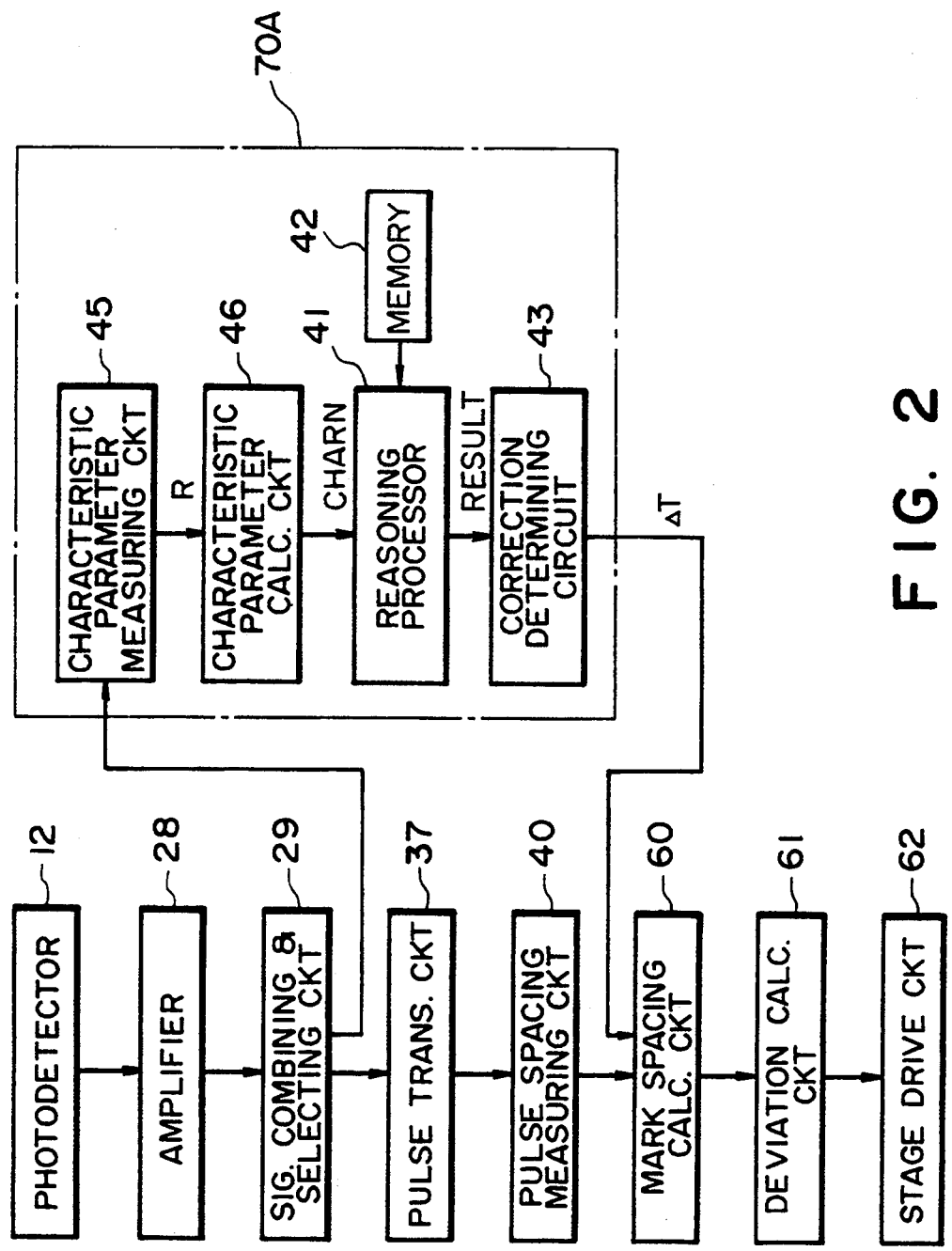
FIG. 2 is a block diagram showing a first embodiment of the present invention.

FIG. 2 is a block diagram of a system according to the first embodiment of the present invention.

Those portions of the signal processing system shown in FIG. 2 which are different from the signal processing system shown in FIG. 26, will now be described in detail.

As compared with the FIG. 26 example, the mark position detecting method and apparatus of the present embodiment uses, in addition to the signal processing made in the FIG. 26 example, such a means 70A provided between the pulse spacing measuring circuit 37 and the mark spacing measuring circuit 40 and being effective to correct a slip Δl, while using a wave height difference R as a characteristic parameter.

In FIG. 2, a characteristic parameter measuring circuit 45 is arranged to detect a wave height difference group R (R101, R102, R103, R104, R105, R106, R107 and R108) by using an alignment signal group SiG supplied from the signal combining and selecting circuit 29. The detected wave height difference group R is transmitted to a characteristic parameter calculating circuit 46. In this characteristic parameter calculating circuit 46, each wave height difference is multiplied by a constant so as to transform the detected wave height difference group R into a data related to the characteristic parameter. The results are supplied to a reasoning processor 41 as a characteristic parameter data group CHARN (D101, D102, D103, D104, D105, D106, D107 and D108).

The reasoning processor 41 functions to execute fuzzy reasoning in accordance with a reasoning rule or rules stored in a memory 42.

An example of such reasoning rule stored in the memory 42 is shown in Table 1.

TABLE 1

"The slip Δl is larger with a large Wave Height Difference R."

(1) If R is PB, then Δl is PB.
(2) If R is PM, then Δl is PM.
(3) If R is PS, then Δl is PS.
(4) If R is ZE, then Δl is ZE.
(5) If R is NS, then Δl is NS.
(6) If R is NM, then Δl is NM.
(7) If R is NB, then Δl is NB.

Table 1 depicts, in terms of rules (1)–(7), an empirical rule that "a slip Δl is larger with a larger wave height difference R".

An explanation will now be provided, taking rule (1) in Table 1 by way of example. In a rule "if R is PB, then Δl is PB", the phrase "R is PB" in the first clause is called an "antecedent", while the phrase "Δl is PB" in the second clause is called a "consequent". The characters PB, PM, PS, ZE, NS, NM and NB used in the antecedents and consequents have the following meaning:

PB: positive and large
PM: positive and middling
PS: positive and small
ZE: zero
NS: negative and small
NM: negative and middling
NB: negative and large The contents of the antecedents and consequences are stored in a memory 42 in the form of membership functions such as depicted in FIG. 7, (A)–(G), and FIG. 8, (A)–(G).

Referring to FIG. 7, a description will be provided of an antecedent "R is ZE" in Table 1. Reference characters $r_1$–$r_7$ on the axis of abscissa in FIG. 7 each denotes a value of a wave height difference R. The axis of ordinate in FIG. 7 denotes the "grade" used in the fuzzy set theory and the data is depicted in terms of a membership function having a value variable between "0" and "1". Illustrated in part (D) of FIG. 7 is a membership function related to an antecedent "R is ZE".

Similarly, the antecedents "R is NB", "R is NM", "R is NS", "R is PS", "R is PM" and "R is PB" assume those membership functions such as depicted in parts (A), (B), (C), (E), (F) and (G) of FIG. 7. Similarly, membership functions of the consequents are illustrated in parts (A)–(G) of FIG. 8.

The reasoning processor 41 to which the data group CHARN (D101-D108) is supplied from the characteristic parameter calculating circuit 46, determines the amount of correction to the wave height difference R by using the contents stored in the memory 42, namely, by use of the reasoning rule shown in Table 1 as well as the membership functions for the antecedent and consequents depicted in parts (A)–(G) of FIG. 7 and parts (A)–(G) of FIG. 8.

FIG. 9, (A)–(E), is an explanatory view for explicating in detail the method of reasoning made in the reasoning processor 41, on the basis of the fuzzy reasoning, in the case where the wave height difference R is equal to $r_0$ (wherein $r_4 < r_0 < r_5$), as an example.

Where the wave height difference R is $r_0$ ($r_4 < r_0 < r_5$), rule (3) and rule (4) are applied as the reasoning rule, in the case of Table 1. That is:

"If R is PS, then Δl is PS."

"If R is ZE, then Δl is ZE."

The reasoning processor 41 reads out the membership functions "PS" and "ZE" of the corresponding antecedents, from the memory 42, and also reads out the membership functions "PS" and "ZE" of the respective consequents corresponding to these antecedents. Then, the reasoning processor discriminates the degree of belonging or dependence of the wave height difference $r_0$ to or on the membership function PS as being "$w_2$", from the points of intersection between the wave height difference $r_0$ and the membership function PS of the antecedent as illustrated in FIG. 9, (A). Thus, as illustrated in FIG. 9, (B), the membership function PS of the consequent is multiplied by "$w_2$" to thereby determine the weight of this consequent (as depicted by a hatched portion in part (B) of FIG. 9). Similarly, the degree of belonging of the wave height difference $r_0$ to the membership function ZE is discriminated as being "$w_1$", from the point of intersection of the wave height difference $r_0$ and the membership function ZE of the antecedent, as shown in FIG. 9, (C). Thus, as illustrated in part (D) of FIG. 9, the membership function ZE of the consequent is multiplied by "$w_1$" to determine the weight of this consequent (as depicted by a hatched portion in part (D) of FIG. 9).

Subsequently, from the conclusions of the reasoning according to the reasoning rules (3) and (4) shown in Table 1, a conclusion Δl of reasoning is determined. To accomplish this, the max. calculation MAX{a,b} is made to the hatched portion as determined in part (B) of FIG. 9 and the hatched portions as determined in part (D) of FIG. 9. The max. calculation is such an operation wherein the value of a is used as a result of calculation where a>b, whereas the value of b is used as a result of calculation where a<b. Subsequently, the center of gravity is determined on the basis of the result of that calculation.

More specifically, where the waveform (the hatched portion in FIG. 9 (E)) to which the max. calculation as depicted in FIG. 9, (E), has been made is denoted by h(l), then the center Δl of gravity can be determined by the following equation:

$$\Delta l = [\int h(l) l \, dl] / [\int h(l) \, dl]$$

The reasoning processor 41 (FIG. 2) functions to execute the calculation, such as described above, with respect to each member of the data group CHARN (D101-D108) produced by the characteristic parameter calculating circuit 46, and to transmit a reasoning result data group (Δl101, Δl102, lΔ103, Δl104, Δl105, Δl106, Δl107 and Δl108) to a correction determining circuit 43 for determining the amount of correction.

In this correction determining circuit 43, the reasoning result data group RESULT (Δl101–Δl108) from the reasoning processor 41 is multiplied by a constant, to thereby prepare correction data group AT (ΔT101, ΔT102, ΔT103, ΔT104, ΔT105, ΔT106, ΔT107 and ΔT108).

The thus prepared data group ΔT is supplied to the mark spacing calculating circuit 60, together with a data group T as obtained at the pulse spacing measuring circuit 40.

Referring back to FIG. 29, the interval between alignment marks 101 and 201 is denoted by W1L; the interval between alignment marks 201 and 102 is denoted by W2L; the interval between alignment marks 102 and 103 is denoted by W3L; the interval between alignment marks 103 and 202 is denoted by W4L; and the interval between alignment marks 202 and 104 is denoted by W5L. Similarly, the interval between alignment marks 105 and 203 is denoted by W1R; the interval between alignment marks 203 and 105 is denoted by W2R; the interval between alignment marks 106 and 107 is denoted by W3R; the interval between alignment marks 107 and 204 is denoted by W4R; and the interval between alignment marks 204 and 108 is denoted by W5R. Then, the mark spacing calculating circuit 60 (FIG. 2) functions to calculate the intervals W1L and W2L in the following manner:

$$W1L = [(T101R + T101F)/2 + \Delta T101] - [(T201R + T201F)/2]$$

$$W2L = [(201R + T201F)/2 + \Delta T102] - (T102R + T102F)/2]$$

Similarly, the remaining intervals W4L, W5L, W1R, W2R, W4R and W5R can be calculated by using the correction data group ΔT.

Data group W (W1L, W2L, W4L, W5L, W1R, W2R, W4R and W5R) obtained at the mark spacing calculating circuit 60 is transmitted to the wafer-to-mask deviation calculating circuit 61.

This deviation calculating circuit 61 functions to calculate the amount of positional deviation (ΔX and ΔY) between the wafer and the mask, by using the data group W, and supplies the results ΔX and ΔY of calculation to the stage driving circuit 62.

The precision attainable in this embodiment in regard to the detection of alignment mark position with a signal indicative of the mark position being corrected on the basis of a characteristic parameter (wave height difference R), in the described manner, is shown in Table 2.

Table 2 illustrates alignment accuracy for a metal layer, wherein characters $\overline{X}$ and $\overline{Y}$ each denotes an average in the X or Y direction, and characters $3\sigma x$ and $3\sigma y$ each denotes dispersion in the x or y direction.

TABLE 2

|  | $\overline{X}$ | $\overline{Y}$ | $3\sigma x$ | $3\sigma y$ |
| --- | --- | --- | --- | --- |
| Uncorrected 1st | ±0.10 | ±0.10 | 0.20–0.22 | 0.20–0.22 |
| Embodiment 2nd | ±0.02 | ±0.02 | 0.14–0.16 | 0.14–0.16 |
| Embodiment 3rd | ±0.01 | ±0.01 | 0.14–0.16 | 0.14–0.16 |
| Embodiment 4th | ±0.01 | ±0.01 | 0.10–0.12 | 0.10–0.12 |
| Embodiment | ±0.01 | ±0.01 | 0.12–0.14 | 0.12–0.14 |

(unit: micron)

FIG. 10, (A), shows in an enlarged view an example of shot layout defined on a wafer 2. The X axis and the Y axis are defined in a horizontal direction and a vertical direction on the sheet of this drawing, respectively, so that the positional coordinates of these shot areas on the wafer 2 can be represented by a coordinate data group (X, Y). While not shown in the drawing, each shot area is provided with one or more wafer alignment marks.

The inventors of the subject application have found that there is an interrelationship between a slip Δl described hereinbefore and the coordinate data group (X, Y) on the shot areas of the wafer 2. In a second embodiment of the present invention, the amount of correction for such a slip Δl is determined by using fuzzy reasoning and on the basis of the wafer position coordinate data group (X, Y).

Figure 3:
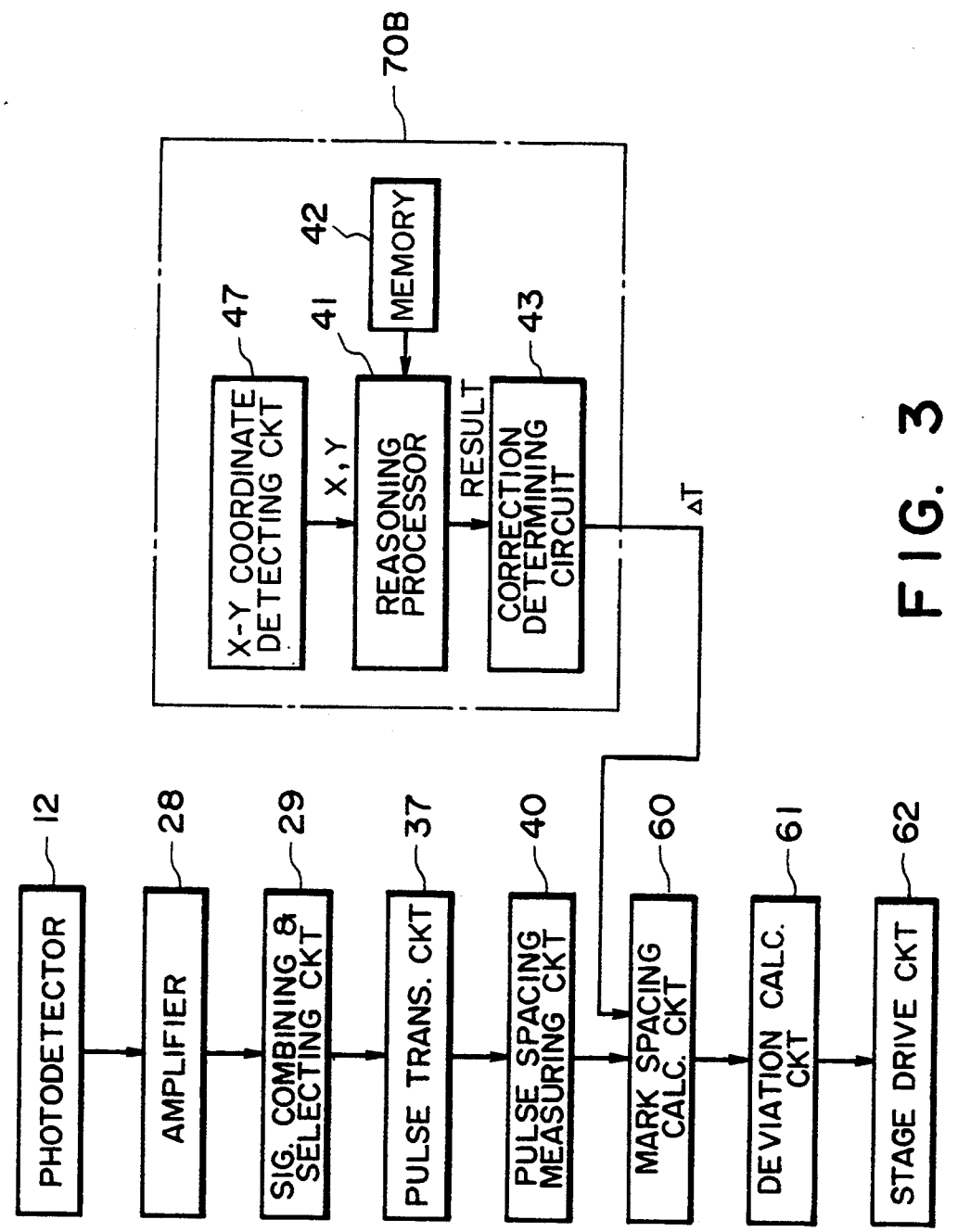
FIG. 3 is a block diagram showing a second embodiment of the present invention.

FIG. 3 is a block diagram of a system which is arranged to execute the mark position detection according to the second embodiment of the present invention.

Those portions of the signal processing system shown in FIG. 3 which are different from the signal processing system shown in FIG. 2, will be described in detail.

One distinctive feature of the second embodiment to the first embodiment lies in that an X-Y coordinate detecting circuit 47 shown in FIG. 3 is provided in place of the characteristic parameter measuring circuit 45 and the characteristic parameter calculating circuit 46 in the FIG. 2 example.

This will now be explained in greater detail, with reference to FIG. 3.

In FIG. 3, the X-Y coordinate detecting circuit 47 is arranged to detect the position coordinate of such a shot area on a wafer 2 (FIG. 10, (A)) which is being the subject of alignment. Also, the X-Y coordinate detecting circuit 47 functions to transmit the detected position coordinate data group (X, Y) to a reasoning processor 41.

In response, the reasoning processor 41 functions in a similar manner as having been described with reference to the first embodiment, to execute fuzzy reasoning on the basis of the reasoning rule or rules stored in a memory 42.

An example of the content of a reasoning rule stored in the memory 42 is shown in Table 3.

TABLE 3

| "Slip Δl depends on Position Coordinate (X, Y) on a Wafer". |
| --- |
| (1) If X is LEFT, then Δl is LA. |
| (2) If X is CENTER, then Δl is MD. |
| (3) If X is RIGHT, then Δl is SM. |
| (4) If Y is UP, then Δl is SM. |
| (5) If Y is CENTER, then Δl is MD. |
| (6) If Y is DOWN, then Δl is LA. |

Table 4 represents, in terms of rules (1)–(6), an empirical rule that "a slip Δl depends on the position (X, Y) of a shot area".

The characters LEFT, CENTER, RIGHT, UP, CENTER, DOWN, SM, MD and LA mean "left-hand side", "central portion", "right-hand side", "upper side", "central portion", "lower side", "small", "middling" and "large".

The contents of the antecedents and consequents described above are stored in the memory 42 in the form of membership functions such as depicted in FIG. 11, (A)–(C); FIG. 12, (A)–(C); and FIG. 13, (A)–(C). Parts (B) and (C) of FIG. 10 illustrate membership functions in the X and Y directions, respectively, in the X-Y coordinate system.

In FIG. 3, the reasoning processor 41 functions to execute fuzzy reasoning on the basis of an appropriate portion of the contents stored in the memory 42 and, in a similar manner as in the first embodiment. It transmits to a correction determining circuit 43 a reasoning result data group RESULT ($\Delta l101$, $\Delta l102$, $\Delta l103$, $\Delta l104$, $\Delta l105$, $\Delta l106$, $\Delta l107$ and $\Delta l108$). The operation to be made in the correction determining circuit 43 and so on is the same as in the first embodiment.

The precision of alignment mark detection with the mark position data being corrected on the basis of the information related to the location of corresponding one of the shot areas on the wafer, is such as shown in Table 2 contained in an earlier part of this specification.

In the present embodiment, as described, the position coordinate (X, Y) of each shot area on a wafer 2 is used as the information which is interrelated with an error in the detection of the position of an alignment mark. However, such external information for the correction is not limited to the positional information (X, Y) as used in the present embodiment. As an example, an environmental condition such as, for example, an atmospheric pressure Pa in which a stepper is placed or any other external information may be used in the present invention, provided that it is interrelated with an error in the mark position detection.

Figure 4:
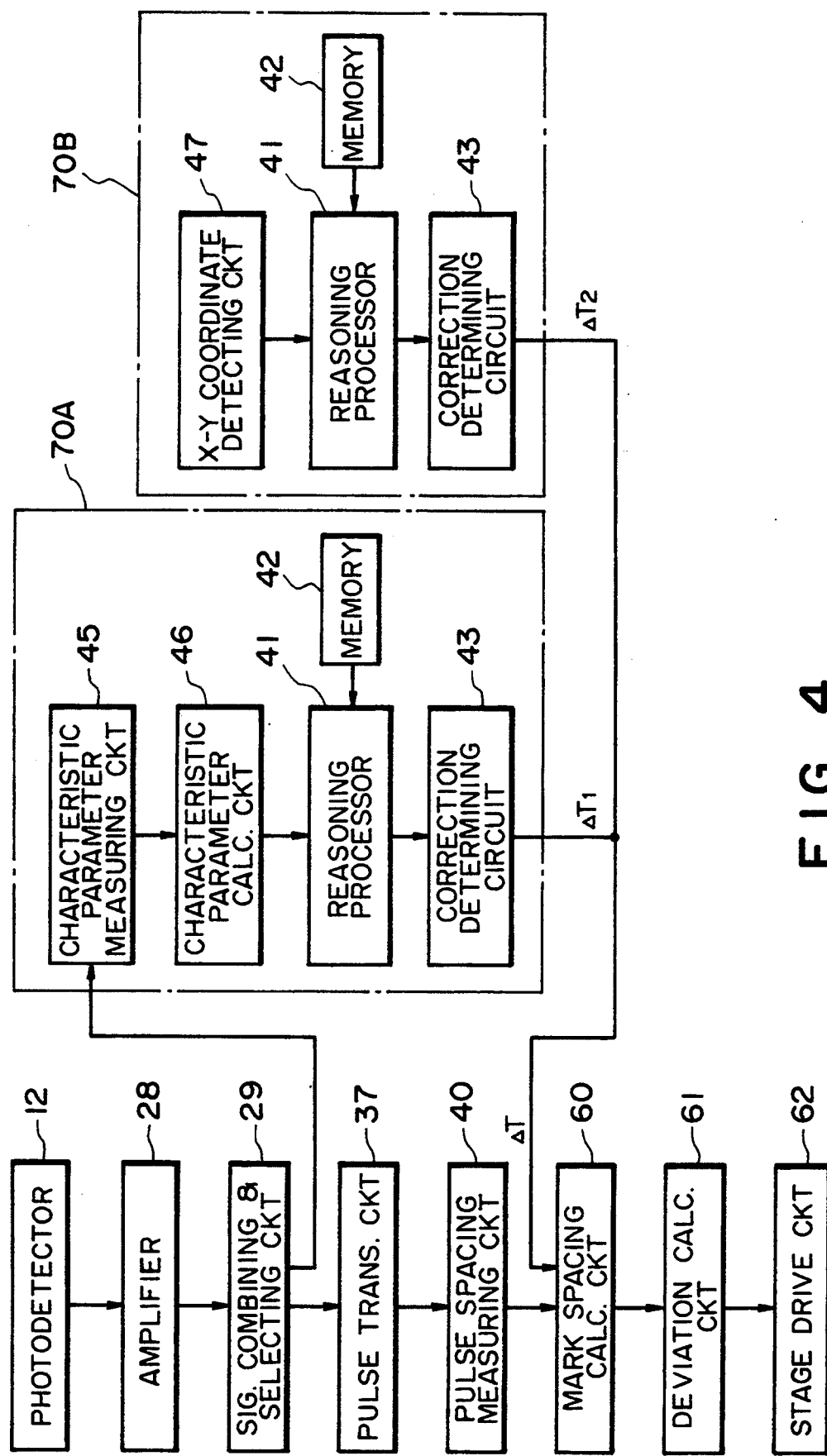
FIG. 4 is a block diagram showing a third embodiment of the present invention.

FIG. 4 is a block diagram of a system according to a third embodiment of the present invention.

Characterizing features of a signal processing system of the third embodiment shown in FIG. 4, in comparison with the signal processing system of the first embodiment shown in FIG. 2, will now be described in detail.

An important feature of the third embodiment lies in that a means 70B effective to execute signal correction on the basis of a position coordinate data group (X, Y), such as described with reference to the second embodiment, is added to a signal processing system having been described with reference to the first embodiment.

In this embodiment, a correcting means 70A of the structure described with reference to the first embodiment, namely, a means for determining the amount of correction in accordance with a data related to the characteristic parameter and on the basis of a detected wave height difference R, is called a "first correcting means". Correcting means 70B of the structure described with reference to the second embodiment, namely, a means for determining the amount of correction on the basis of a position coordinate data group (X, Y), is called a "second correcting means". Where an output data group from the first correcting means is denoted by $\Delta T_1$ and an output data group from the second correcting means is denoted by $\Delta T_2$, a resultant correcting amount data group $\Delta T$ is given by $\Delta T = \Delta T_1 + \Delta T_2$ which is applied to a mark spacing measuring circuit 60 together with an output data group T from a pulse spacing measuring circuit 40, and they are processed in a similar manner as the first embodiment.

The mark position detecting method according to this (third) embodiment can provide a precision of alignment mark position detection such as set fourth in Table 2 contained in an earlier part of this Specification.

In the present embodiment, as described, two correction signals, namely, a wave height difference R which is a characteristic parameter interrelated with an error in the detection of an alignment mark position and a position coordinate data group (X, Y) interrelated with an alignment error, are used. However, two or more other correction signals obtainable, for example, from a peak spacing DIS (FIG. 6), a slice width W, any other information data interrelated to the alignment error (e.g., an atmospheric pressure Pa in which a stepper is placed), etc., may be used in combination.

Figure 5:
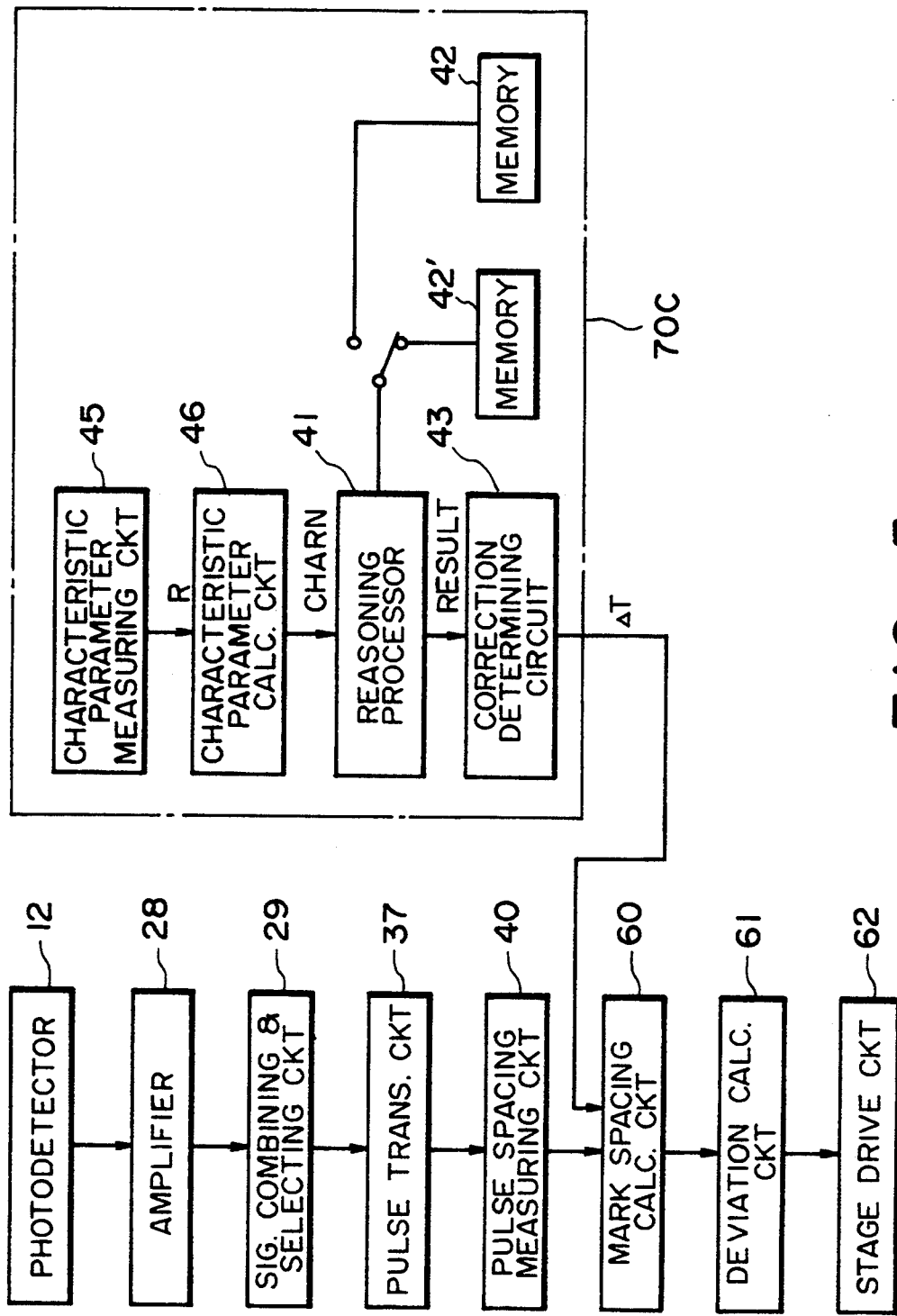
FIG. 5 is a block diagram showing a fourth embodiment of the present invention.

Referring now to FIG. 5, a description will be provided of a fourth embodiment of the present invention. An important feature of this embodiment, in comparison with the first embodiment shown in FIG. 2, lies in that an interchangeable memory 42' is provided in addition to the memory 42 (FIG. 2) such that reasoning rules in the memory means are made selectable.

More specifically, in accordance with the present embodiment, if in the first embodiment an obtained alignment accuracy does not satisfy a desired, it is possible to change the content of the memory means from a data stored in the memory 42 to a data stored in the memory 42'. Thus, it is possible to accomplish further improvements in the alignment accuracy.

The changes in the content of the memory means will be such as follows:

The reasoning rules in Table 1 are changed to those set forth in Table 4.

TABLE 4

| |
|---|
| (1) If R is PB, then $\Delta l$ is PB. |
| (2) If R is PM, then $\Delta l$ is PS. |
| (3) If R is PS, then $\Delta l$ is PS. |
| (4) If R is ZE, then $\Delta l$ is ZE. |
| (5) If R is NS, then $\Delta l$ is NS. |
| (6) If R is NM, then $\Delta l$ is NM. |
| (7) If R is NB, then $\Delta l$ is NM. |

More specifically, "PM" in the consequent of rule (2) in Table 1 is changed to "PS", while "NB" in the consequent of rule (7) is changed to "NM". Additionally, $r_1-r_7$ in the antecedents are replaced by $r_1'-r_7'$, while $l_1-l_7$ in the consequents are replaced by $l_1'-l_7'$.

Membership functions usable in this embodiment are depicted in FIG. 14, (A)-(G), and FIG. 15, (A)-(G). In accordance with the reasoning rules set forth in Table 4, a slip $\Delta l$ is determined and, by using this slip $\Delta l$, correction is made to a signal indicative of the mark position.

The mark position detecting method according to this (fourth) embodiment can attain mark detection accuracy as set forth in Table 2 contained in an earlier part of this specification.

In this embodiment, as described, the content of the memory means such as set in accordance with the first embodiment is changed selectively as desired, in order to assure further improvement in the precision. However, such a selecting function is not applicable only to the first embodiment. Rather, it is applicable also to any other reasoning in which an empirical rule or rules can be expressed in a manner suited to the fuzzy reasoning, as in the cases of the second and third embodiments.

In the first embodiment described hereinbefore, a wave height difference R of electric signals produced by photoelectrically converting light reflected from alignment marks is used as a characteristic parameter for the correction of the mark position signals. In the following part of this specification a, description will be provided of a method according to which a different characteristic parameter other than the wave height difference R is obtained from electric signals produced as a result of photoelectric conversion and, by using this characteristic parameter, the mark position signal is corrected.

In a signal waveform view of FIG. 6, the widths $W_{101}$ and $W_{102}$ of two combined wave signals S101 and S102, can be detected by using the intersections T101R, T101F, T102R and T102F of these signals with their slice levels SLC 101 and SLC 102. The calculations are made in the following manner:

$$W_{101} = T101F - T101R$$

$$W_{102} = T102F - T102R$$

The correcting amount corresponding to the signal width group ($W_{101}$, $W_{102}$, ...) comprising signal widths $W_{101}$, $W_{102}$, ... ), namely, a slip group ($\Delta 101$, $\Delta 102$, ...), is determined by a microprocessor 39 in accordance with the fuzzy reasoning.

An empirical rule usable in the fuzzy reasoning in this embodiment is such as set forth in Table 5. Membership functions in the antecedents and consequents of such empirical rule are depicted in FIG. 16, (A)-(D), and FIG. 17, (A)-(D). The reasoning manner is substantially the same as that in the first embodiment.

TABLE 5

Empirical Rule: "Correction $\Delta l$ is larger with a larger Width W."

(1) If W is LARGE, then $\Delta l$ is LARGE.
(2) If W is MEDIUM, then $\Delta l$ is MEDIUM.
(3) If W is SMALL, then $\Delta l$ is SMALL.

Table 6 given below shows the precision in the alignment mark position detection as attainable by the method of the present embodiment.

TABLE 6

|  | $\overline{X}$ | $\overline{Y}$ | $3\sigma x$ | $3\sigma y$ |
|---|---|---|---|---|
| Uncorrected | ±0.10 | ±0.10 | 0.2–0.22 | 0.2–0.22 |
| Corrected | ±0.22 | ±0.02 | 0.15–0.17 | 0.15–0.17 |

(unit: micron)

Next, a description will be provided of an example in which the degree of symmetry of combined wave signals S101 and S102 is used as a characteristic parameter.

Figure 21:
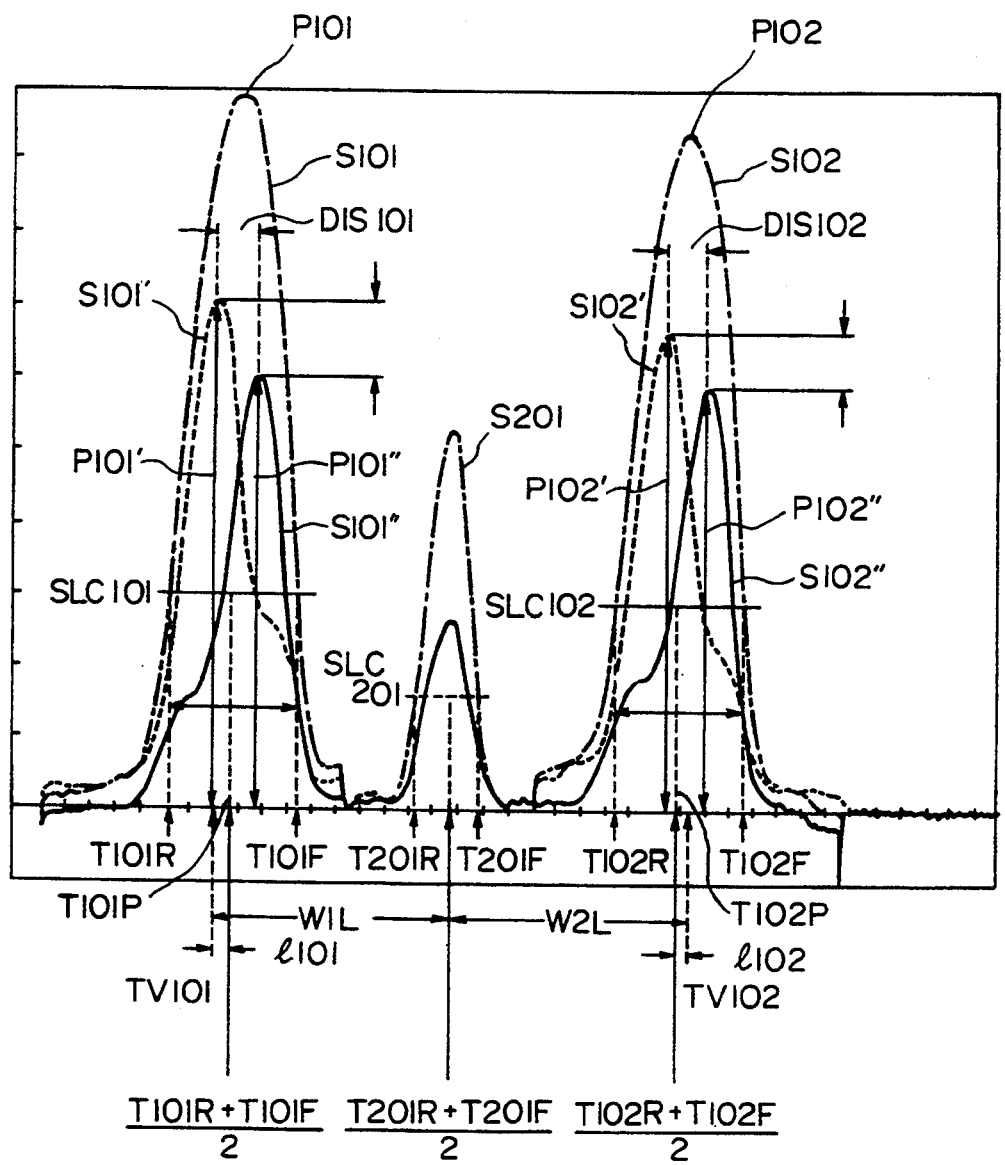
FIG. 21 is a waveform view for explicating the method according to the fifth embodiment.

Signal waveform view of FIG. 21 is a representation illustrating peak values and the degree of symmetry of combined wave signals S101 and S102. The peak value of the signal S101 is denoted at P101, and the peak value of the signal S102 is denoted at P102. Where the moments at which these peak values appear are denoted by T101P and T102P, the degree of symmetry of each combined wave signal can be detected by calculating a differential signal DIF101 or DIF102 in the following manner:

$$DIF101 = T101P - (T101R + T101F)/2$$

$$DIF102 = T102P - (T102R + T102F)/2$$

Figure 20:
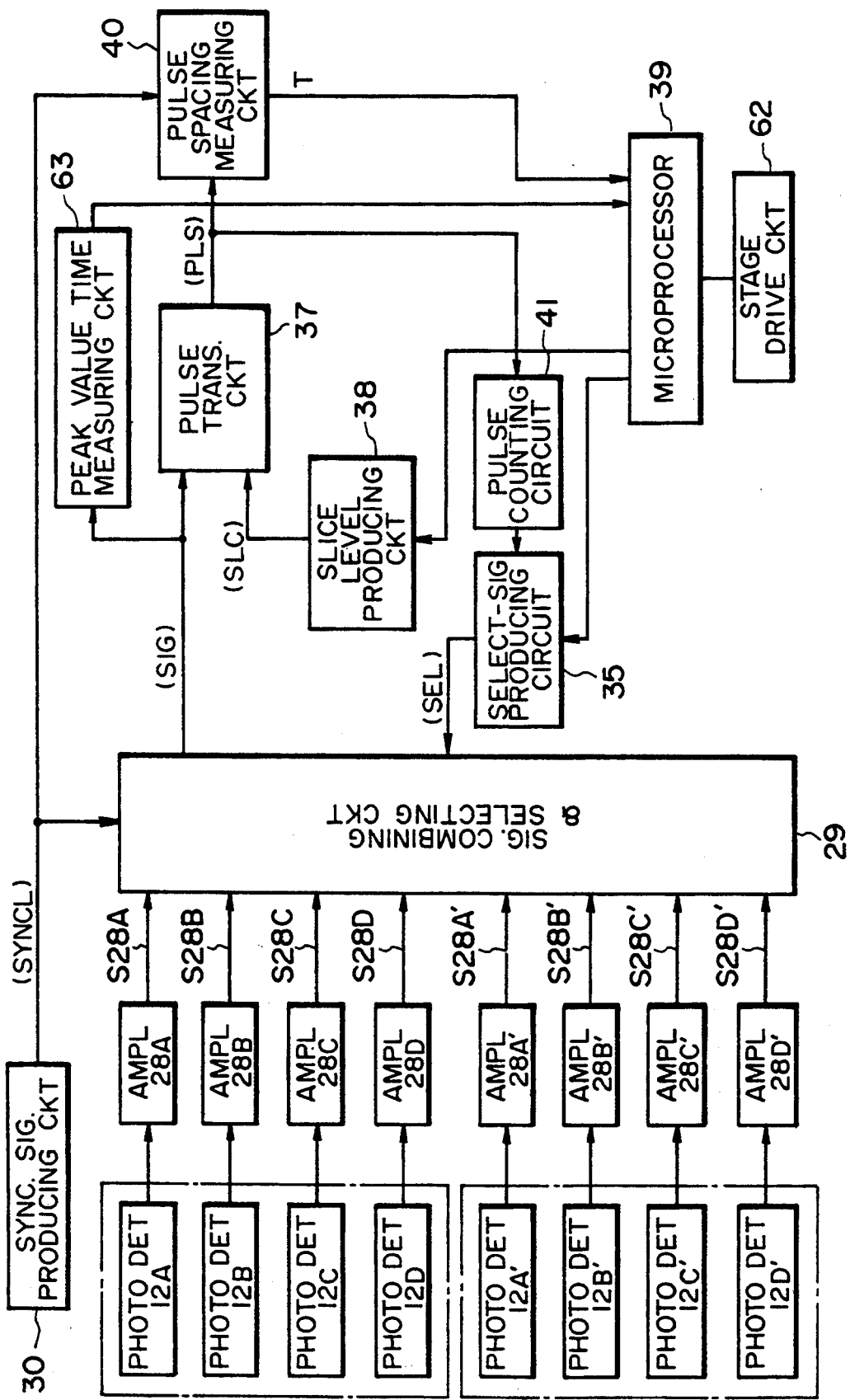
FIG. 20 is a block diagram of a system adapted to execute a method according to the fifth embodiment.

The present embodiment uses such a differential signal group (DIF101, DIF102, ...) to determine the amount of correction, namely, a slip group ($\Delta l101$, $\Delta l102$, $\Delta l103$, ...) by means of a microprocessor 39 (FIG. 20) and in accordance with the fuzzy reasoning. In FIG. 20, denoted at 63 is a peak value time measuring circuit which is effective to detect the time of the peak value of each combined wave signal, by using a signal group SiG from a signal combining and selecting circuit 29. An output of this measuring circuit is connected to the microprocessor 39. The remaining portion of the FIG. 20 structure is the same as described hereinbefore.

An empirical rule usable in this embodiment for execution of the fuzzy reasoning is set forth in Table 7. Membership functions of the antecedents and consequents of such empirical rule are depicted in FIG. 18, (A)-(D), and FIG. 19, (A)-(D). The manner of fuzzy reasoning in this embodiment is substantially the same as in the foregoing embodiments.

TABLE 7

Empirical Rule: "Correction $\Delta l$ is larger with a larger DIF."

(1) If DIF is NE, then $\Delta l$ is NE. (NE: negative)
(2) If DIF is XE, then $\Delta l$ is ZE. (ZE: zero)
(3) If DIF is PO, then $\Delta l$ is PO. (PO: positive)

With the method of this embodiment, the error in the detection of the alignment mark position can be reduced to a value substantially equal to that given in Table 6, contained in an earlier part of this Specification.

Next, a description will be provided of an example wherein any inclination of combined wave signals S101 and S102 is used as a characteristic parameter.

Figure 23:
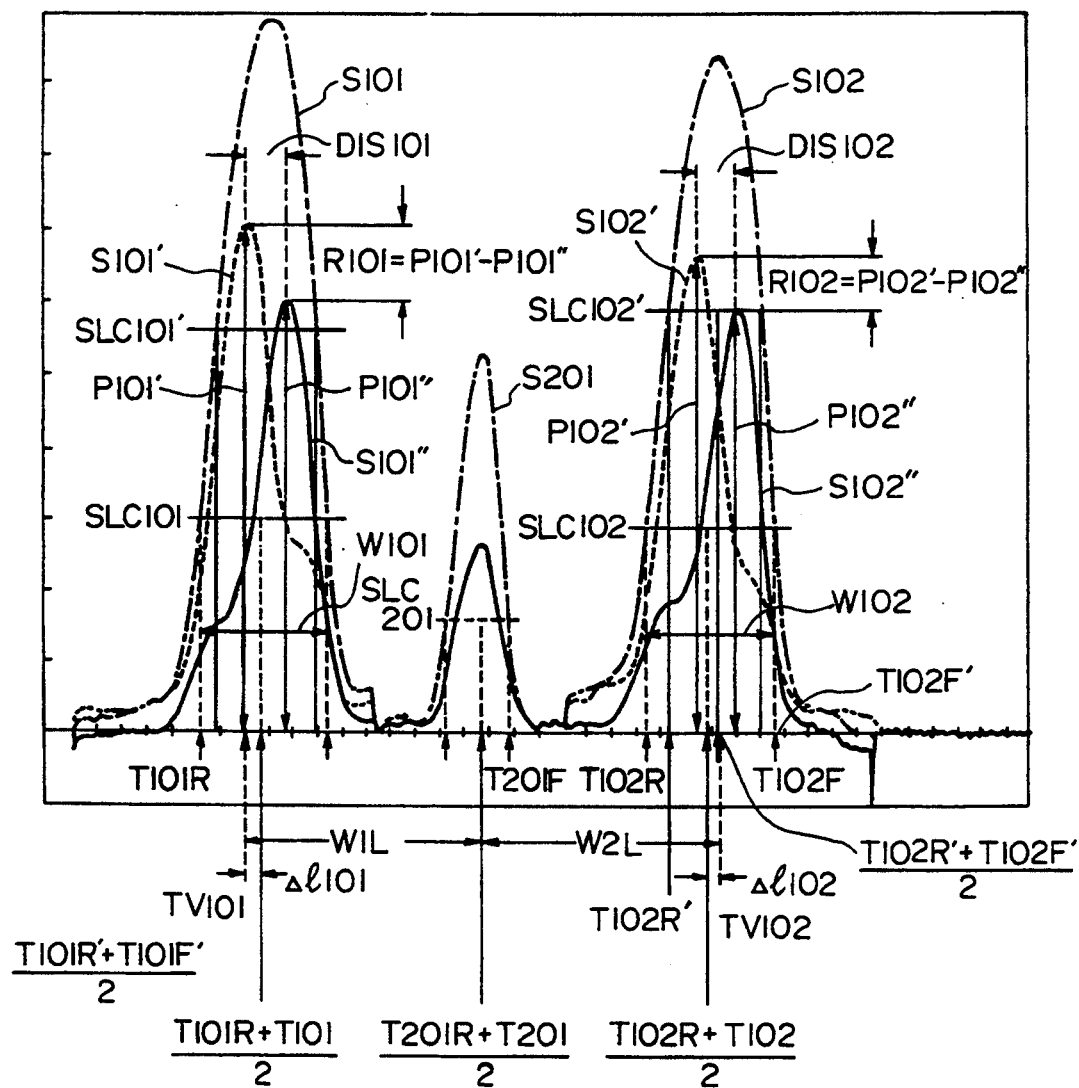
FIG. 23 is a signal waveform view for explicating the method according to the sixth embodiment.

The signal waveform view of FIG. 23 is a representation illustrating the amount of inclination of combined signal waves S101 and S102. Where the points of intersection of the combined signal waves S101 and S102 with their slice levels SLC101' and SLC102' are denoted by T101R', T101F', T102R' and T102F', then the inclinations grad101 and grad 102 can be calculated by the following equations:

$$grad101 = (T101R' + T101F')/2 - (T101R + T101F)/2$$

$$grad102 = (T102R' + T102F')/2 - (T102R + T102F)/2$$

Then, by using such an inclination group (grad101, grad102, ...), the amount of correction, namely, a slip group ($\Delta l101$, $\Delta l102$, ...) is determined by means of a microprocessor 39 (FIG. 22) and in accordance with the fuzzy reasoning.

Figure 22:
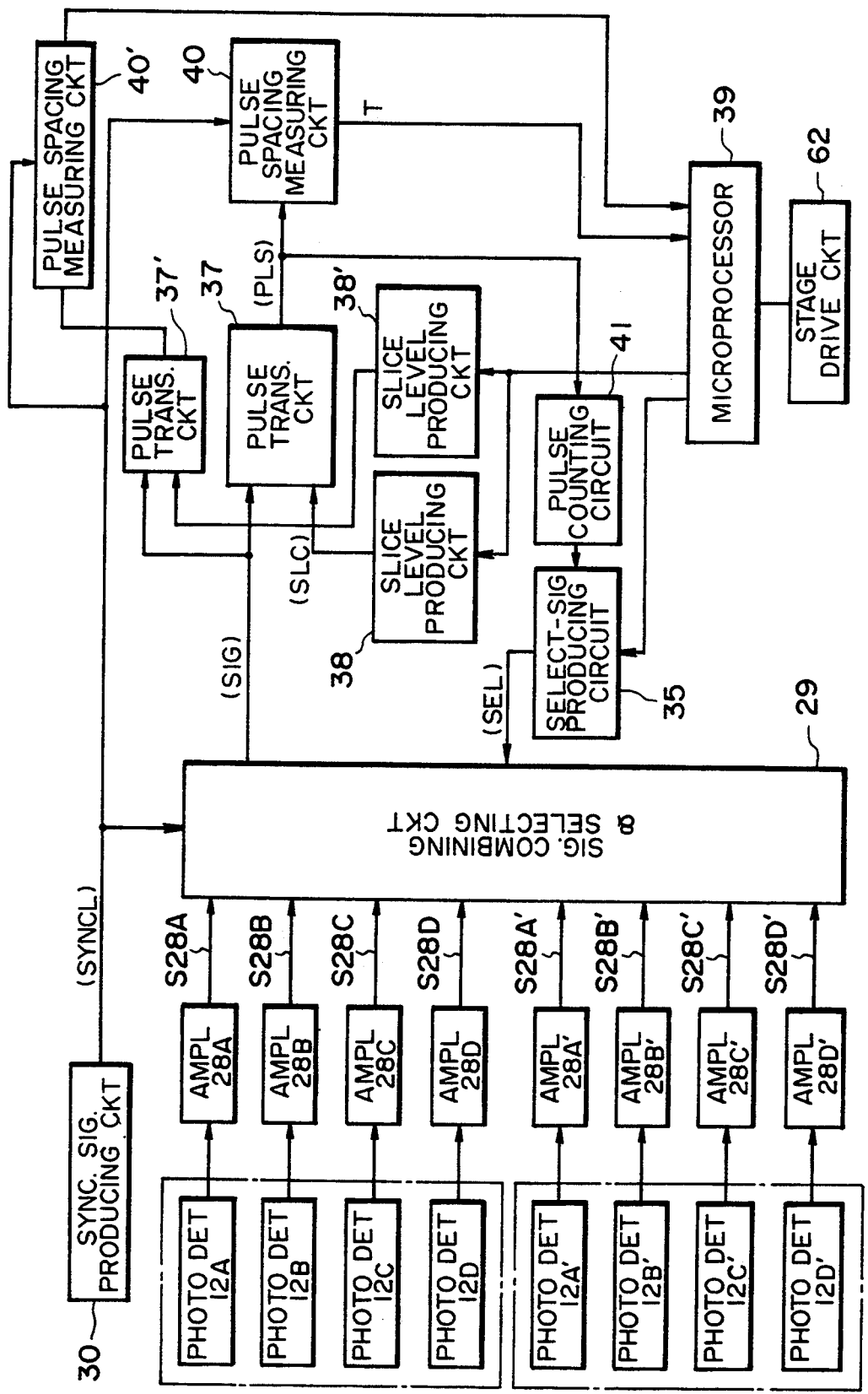
FIG. 22 is a block diagram of a system adapted to execute the method according to the sixth embodiment.

In FIG. 22, denoted at 37' is a pulse transformation circuit for transforming a signal group SiG from a signal combining and selecting circuit 29 into pulses by using slice levels SLC101', SLC102', ...; and denoted at 40' is a pulse spacing measuring circuit for measuring rise time T101R', etc. and fall time T101F' etc of each signal having been pulse-transformed by the pulse transformation circuit 37', from a reference point. An output of the pulse spacing measuring circuit is connected to the microprocessor 39. Denoted at 38' is a slice level producing circuit for producing slice levels SLC101', SLC102', ..., in accordance with instruction signals supplied thereto from the microprocessor 39. The remaining portion of the FIG. 22 structure is the same as the foregoing embodiments.

An empirical rule usable in this embodiment for execution of fuzzy reasoning is set forth in Table 8. Membership functions of the antecedents and consequents of such empirical rule may be similar to those as depicted in FIG. 18, (A)-(D), and FIG. 19, (A)-(D).

TABLE 8

Empirical Rule: "Correction $\Delta l$ is larger with a larger grad."

(1) If grad is NE, then $\Delta l$ is NE. (NE: negative)
(2) If grad is ZE, then $\Delta l$ is ZE. (ZE: zero)

TABLE 8-continued (3) If grad is PO, then Δl is PO. (PO: positive)

The method of the present embodiment can achieve a precision in the detection of the alignment mark position, substantially the same as that given in Table 6 contained in an earlier part of this specification.

In the foregoing embodiments, a description will be provided of some cases in which the alignment mark arrangement is such that one mask alignment mark is sandwiched between two wafer alignment marks. However, the arrangement of alignment marks, the shape of each mark, and so on are not limited to the described form. For example, the present invention is applicable to such an alignment system in which a mask is held immovable at a certain position, while an alignment mark or marks provided on a wafer is observed through an image pickup device to measure the mark position, to thereby detect any relative positional deviation of the wafer with respect to the fixed position of the mask.

From the foregoing description, it will be readily understood that the present invention can provide the following advantageous results.

(1) It is possible to attain high-precision position detection, as seen in Table 2, even in regard to a mark pattern formed of an aluminum (with respect to which high-precision detection is difficult to attain with conventional detecting methods).

(2) Since fuzzy operation (reasoning, in the form of "If . . . , then . . . " is used in determination of the amount of correction and also since each antecedent and each consequent is expressed in accordance with a fuzzy set, flexible reasoning is possible.

(3) It is possible that the result of parameter analysis made by an process engineer is fed back to the reasoning rule, the antecedent, the consequent and the like. Therefore, high-precision position detection is easily attainable.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a position of a mark comprising the steps of:

storing, in memory means, more than two reasoning rules, wherein the reasoning rules include at least two of a first reasoning rule with respect to a characteristic parameter determined on the basis of a wave form of a mark signal, a second reasoning rule with respect to a characteristic parameter predetermined on the basis of a position of the mark on an object, a third reasoning rule with respect to a characteristic parameter determined on the basis of a plurality of mark signals, and a fourth reasoning rule with respect to a characteristic parameter determined on the basis of an ambience condition of a mark detecting means;

detecting the mark with the mark detecting means to obtain a mark signal;

executing fuzzy reasoning using the mark signal obtained in said detecting step on the basis of at least two reasoning rules stored in said storing step and at least two characteristic parameters corresponding to the at least two reasoning rules and changing the reasoning rules used in said executing step so that fuzzy reasoning is also executed on the basis of the changed fuzzy reasoning rules; and determining the position of the mark on the basis of the fuzzy reasoning executed in said executing step using at least one of: the at least two reasoning rules and the changed reasoning rules.

2. A method according to claim 1, wherein the characteristic parameter determined on the basis of the wave form of a mark signal is related to at least one of the wave height, the inclination, and the width of the mark signal.

3. A method according to claim 1, wherein the characteristic parameter determined on the basis of a plurality of mark signals is related to at least one of the wave height difference, the spacing, and the symmetry of the mark signals.

4. A method according to claim 1, wherein the characteristic parameter determined on the basis of an ambience condition is related to an ambience pressure of the mark detecting means.

5. A method according to claim 1, wherein, with regard to the at least one characteristic parameter corresponding to the at least one reasoning rule, said method further comprises the step of preparing an additional reasoning rule and wherein, said executing step comprises the step of selecting one of the at least one reasoning rules and the additional reasoning rule.

6. A device for detecting a position of a mark, comprising:

mark detecting means for detecting the mark to obtain a corresponding mark signal;

memory means for storing therein more than two reasoning rules, the reasoning rules including at least two of a first reasoning rule with respect to a characteristic parameter determined on the basis of a wave form of the mark signal, a second reasoning rule with respect to a characteristic parameter determined on the basis of a position of the mark on an object, a third reasoning rule with respect to a characteristic parameter determined on the basis of a plurality of mark signals, and a fourth reasoning rule with respect to a characteristic parameter determined on the basis of an ambience condition of said mark detecting means;

reasoning means for executing fuzzy reasoning using the mark signal obtained by said mark detecting means on the basis of the at least two reasoning rules and at least two characteristic parameters corresponding to the at least two reasoning rules;

means for changing the reasoning rules used by said reasoning means, wherein said reasoning means also executes fuzzy reasoning on the basis of the changed reasoning rules; and position determining means for determining the position of the mark on the basis of the fuzzy reasoning using at least one of: the at least two reasoning rules and the changed reasoning rules.

7. A device according to claim 6, wherein the characteristic parameter determined on the basis of the wave form of a mark signal is related to at least one of the wave height, the inclination, and the width of the mark signal.

8. A device according to claim 6, wherein the characteristic parameter determined on the basis of a plurality of mark signals is related to at least one of the wave height difference, the spacing, and the symmetry of the mark signals.

9. A device according to claim 6, wherein the characteristic parameter determined on the basis of an ambience condition is related to an ambience pressure of said mark detecting means.

10. A device according to claim 6, wherein, with regard to said at least one characteristic parameter corresponding to the at least one reasoning rule, an additional reasoning rule is prepared and stored in said memory means, and wherein, said reasoning means selects one of the at least one reasoning rules and the additional reasoning rule to execute the fuzzy reasoning.

11. A device according to claim 6, wherein said memory means stores the at least one reasoning rule as a membership function.

12. A positioning device for positioning different zones of a wafer in sequence by using marks provided in relation to the zones, respectively, said device comprising:
- mark detecting means for detecting the mark of a particular zone of the wafer to obtain a corresponding mark signal;
- memory means for storing therein more than two reasoning rules, the reasoning rules including at least two of a first reasoning rule with respect to a characteristic parameter determined on the basis of a wave form of the mark signal, a second reasoning rule with respect to a characteristic parameter determined on the basis of a position of the particular zone on the wafer, a third reasoning rule with respect to a characteristic parameter determined on the basis of a plurality of mark signals, and a fourth reasoning rule with respect to a characteristic parameter determined on the basis of an ambience condition of said positioning device;
- positioning means for executing fuzzy reasoning using the mark signal obtained by said mark detecting means on the basis of the at least two reasoning rules and at least two characteristic parameters corresponding to the at least two reasoning rules; and
- means for changing the reasoning rules used by said positioning means, wherein said positioning means also executes fuzzy reasoning on the basis of the changed reasoning rules, wherein said positioning means positions the particular zone of the wafer on the basis of the fuzzy reasoning using at least one of: the changed reasoning rules and the at least two reasoning rules.

13. An apparatus for transferring a pattern of a mask onto a wafer, comprising:
- mark detecting means for detecting a mark of the wafer to obtain a corresponding mark signal;
- memory means for storing therein more than two reasoning rules, the reasoning rules including at least two of a first reasoning rule with respect to a characteristic parameter determined on the basis of a wave form of the mark signal, a second reasoning rule with respect to a characteristic parameter determined on the basis of a position of the mark on the wafer, a third reasoning rule with respect to a characteristic parameter determined on the basis of a plurality of mark signals, and a fourth reasoning rule with respect to a characteristic parameter determined on the basis of an ambience condition of said mark detecting means;
- reasoning means for executing fuzzy reasoning using the mark signal obtained by said mark detecting means on the basis of the at least two reasoning rules and at least two characteristic parameters corresponding to the at least two reasoning rules;
- means for changing the reasoning rules used by said reasoning means, wherein said reasoning means also executes fuzzy reasoning on the basis of the changed reasoning rules;
- position means for positioning the wafer on the basis of the fuzzy reasoning using at least one of: the at least two reasoning rules and the changed reasoning rules; and
- transfer means for transferring the pattern of the mask onto the positioned wafer positioned by said position means.

14. A semiconductor device manufacturing method, comprising the steps of:
- storing, in memory means, more than two reasoning rules, the reasoning rules including at least two of a first reasoning rule with respect to a characteristic parameter determined on the basis of a wave form of a mark signal, a second reasoning rule with respect to a characteristic parameter determined on the basis of a position of a mark on the wafer, a third reasoning rule with respect to a characteristic parameter determined on the basis of a plurality of mark signals, and a fourth reasoning rule with respect to a characteristic parameter determined on the basis of an ambience condition of a mark detecting means;
- detecting a mark of the wafer with the mark detecting means to obtain a mark signal;
- executing fuzzy reasoning using the mark signal obtained in said detecting step on the basis of the at least two reasoning rules and at least two characteristic parameters corresponding to the at least two reasoning rules and changing the reasoning rules used in said executing step so that fuzzy reasoning is also executed on the basis of the changed reasoning rules;
- positioning the wafer on the basis of the fuzzy reasoning using at least one of: the at least two reasoning rules and the changed reasoning rules; and
- printing a semiconductor device pattern on a photosensitive material applied to the wafer.

15. A method according to claim 14, wherein the characteristic parameter determined on the basis of the wave form of a mark signal is related to at least one of the wave height, the inclination, and the width of the mark signal.

16. A method according to claim 14, wherein the characteristic parameter determined on the basis of a plurality of mark signals is related to at least one of the wave height difference, the spacing, and the symmetry of the mark signals.

17. A method according to claim 14, wherein the characteristic parameter determined on the basis of an ambience condition is related to an ambience pressure of the mark detecting means.

18. A method according to claim 14, wherein, with regard to the at least one characteristic parameter corresponding to said at least one reasoning rule, said method further comprises the step of preparing an additional reasoning rule, and wherein said executing step comprises the step of selecting one of the at least one reasoning rules and the additional reasoning rule.

19. A method of detecting a position of a mark comprising the steps of:
- storing, in memory means, a plurality of reasoning rules, one reasoning rule being stored with respect to a characteristic parameter determined on the basis of a waveform of a mark signal;

detecting the mark with mark detecting means to obtain the mark signal;

executing fuzzy reasoning using the mark obtained in said detecting step on the basis of one of the reasoning rules stored in said storing step and the characteristic parameter and changing the reasoning rule used in said executing step so that fuzzy reasoning is also executed on the basis of the changed reasoning rule; and determining the position of the mark on the basis of the fuzzy reasoning executed in said executing step using at least one of: the one of the reasoning rules and the changed reasoning rule.

20. A method according to claim 19, wherein the characteristic parameter determined on the basis of the waveform of the mark signal is related to at least one of the wave height, the inclination, and the width of the mark signal.

21. A method according to claim 19, wherein said method further comprises the step of preparing an additional reasoning rule with respect to the characteristic parameter and wherein said executing step comprises the step of selecting one of the reasoning rules and the additional reasoning rule.

22. A device for detecting a position of a mark, comprising:

mark detecting means for detecting the mark to obtain a corresponding mark signal;

memory means for storing therein a plurality of reasoning rules, one reasoning rule being stored with respect to a characteristic parameter determined on the basis of a waveform of the mark signal;

reasoning means for executing fuzzy reasoning using the mark obtained in said mark detecting step on the basis of one of the reasoning rules and the characteristic parameter;

means for changing the reasoning rule used by said reasoning means, wherein said reasoning means also executes fuzzy reasoning on the basis of the changed reasoning rule; and position determining means for determining the position of the mark on the basis of the fuzzy reasoning using at least one of: the one of the reasoning rules and the changed reasoning rule.

23. A device according to claim 22, wherein the characteristic parameter determined on the basis of the waveform of a mark signal is related to at least one of the wave height, the inclination, and the width of the mark signal.

24. A device according to claim 22, wherein said memory means stores an additional reasoning rule prepared with respect to the characteristic parameter, and wherein said reasoning means selects one of the reasoning rule and the additional reasoning rule to execute the fuzzy reasoning.

25. A device according to claim 22, wherein said memory means stores the reasoning rule as a membership function.

26. A positioning device for positioning different zones of a wafer in sequence by using marks provided in relation to the zones, respectively, said device comprising:

mark detecting means for detecting the mark of a particular zone of the wafer to obtain a corresponding mark signal;

memory means for storing therein a plurality of reasoning rules, one reasoning rule being stored with respect to a characteristic parameter determined on the basis of a waveform of the mark signal;

positioning means for executing fuzzy reasoning using the mark obtained by said mark detecting means on the basis of one of the reasoning rules and the characteristic parameter; and means for changing the reasoning rule used by said positioning means, wherein said positioning means also executes fuzzy reasoning on the basis of the changed reasoning rule, wherein said positioning means positions the particular zone of the wafer on the basis of the fuzzy reasoning using at least one of: the one of the reasoning rules and the changed reasoning rule.

27. An apparatus for transferring a pattern of a mask onto a wafer, comprising:

mark detecting means for detecting a mark of the wafer to obtain a corresponding mark signal;

memory means for storing therein a plurality of reasoning rules, one reasoning rule being stored with respect to a characteristic parameter determined on the basis of a waveform of the mark signal;

reasoning means for executing fuzzy reasoning using the mark obtained by said mark detecting means on the basis of one of the reasoning rules and the characteristic parameter;

means for changing the reasoning rule used by said reasoning means, wherein said reasoning means also executes fuzzy reasoning on the basis of the changed reasoning rule;

positioning means for positioning the wafer on the basis of the fuzzy reasoning using at least one of: the one of the reasoning rules and the changed reasoning rule; and transfer means for transferring the pattern of the mask onto the positioned wafer.

28. A semiconductor device manufacturing method, comprising the steps of:

storing, in memory means, a plurality of reasoning rules, one reasoning rule being stored with respect to a characteristic parameter determined on the basis of a waveform of a mark signal;

detecting a mark of the wafer with mark detecting means to obtain a mark signal;

executing fuzzy reasoning using the mark obtained in said detecting step on the basis of one of the reasoning rules and the characteristic parameter and changing the reasoning rule used in said executing step so that fuzzy reasoning is also executed on the basis of the changed reasoning rule;

positioning the wafer on the basis of the fuzzy reasoning using at least one of: the one of the reasoning rules and the changed reasoning rule; and printing a semiconductor device pattern on a photosensitive material applied to the wafer.

29. A method according to claim 28, wherein the characteristic parameter determined on the basis of the waveform of a mark signal is related to at least one of the wave height, the inclination, and the width of the mark signal.

30. A method according to claim 28, wherein said method further comprises the step of preparing an additional reasoning rule with respect to the characteristic parameter, and wherein said executing step comprises the step of selecting one of the reasoning rules and the additional reasoning rule.

31. A method of detecting a position of a mark comprising the steps of:
- storing, in memory means, a plurality of reasoning rules, one reasoning rule being stored with respect to a characteristic parameter determined on the basis of a plurality of mark signals;
- detecting the mark with mark detecting means to obtain a mark signal;
- executing fuzzy reasoning using the mark signal obtained in said detecting step on the basis of one of the reasoning rules stored in said storing step and the characteristic parameter and changing the reasoning rule used in said executing step so that fuzzy reasoning is also executed on the basis of the changed reasoning rule;
- determining the position of the mark on the basis of the fuzzy reasoning executed in said executing step using at least one of: the one of the reasoning rules and the changed reasoning rule.

32. A method according to claim 31, wherein the characteristic parameter determined on the basis of a plurality of mark signals is related to at least one of the wave height difference, the spacing, and the symmetry of the mark signals.

33. A method according to claim 31, wherein said method further comprises the step of preparing an additional reasoning rule with respect to the characteristic parameter and wherein said executing step comprises the step of selecting one of the reasoning rules and the additional reasoning rule.

34. A device for detecting a position of a mark, comprising:
- mark detecting means for detecting the mark to obtain a corresponding mark signal;
- memory means for storing therein a plurality of reasoning rules, one reasoning rule being stored with respect to a characteristic parameter determined on the basis of a plurality of mark signals;
- reasoning means for executing fuzzy reasoning using the mark signal obtained by said mark detecting means on the basis of one of the reasoning rules and the characteristic parameter;
- means for changing the reasoning rule used by said reasoning means, wherein said reasoning means also executes fuzzy reasoning on the basis of the changed reasoning rule changed by said changing means; and
- position determining means for determining the position of the mark on the basis of the fuzzy reasoning using at least one of: the one of the reasoning rules and the changed reasoning rule.

35. A device according to claim 34, wherein the characteristic parameter determined on the basis of a plurality of mark signals is related to at least one of the wave height difference, the spacing, and the symmetry of the mark signals.

36. A device according to claim 34, wherein said memory means stores an additional reasoning rule prepared with respect to the characteristic parameter, and wherein said reasoning means selects one of the reasoning rule and the additional reasoning rule to execute the fuzzy reasoning.

37. A device according to claim 34, wherein said memory means stores the reasoning rule as a membership function.

38. A positioning device for positioning different zones of a wafer in sequence by using marks provided in relation to the zones, respectively, said device comprising:
- mark detecting means for detecting the mark of a particular zone of the wafer to obtain a corresponding mark signal;
- memory means for storing therein a plurality of reasoning rules, one reasoning rule being stored with respect to a characteristic parameter determined on the basis of a plurality of mark signals;
- positioning means for executing fuzzy reasoning using the mark signal obtained by said mark detecting means on the basis of one of the reasoning rules and the characteristic parameter; and
- means for changing the reasoning rule used by said positioning means, wherein said positioning means also executes fuzzy reasoning on the basis of the changed reasoning rule, wherein said positioning means positions the particular zone of the wafer on the basis of the fuzzy reasoning using at least one of: the one of the reasoning rules and the changed reasoning rule.

39. An apparatus for transferring a pattern of a mask onto a wafer, comprising:
- mark detecting means for detecting a mark of the wafer to obtain a corresponding mark signal;
- memory means for storing therein a plurality of reasoning rules, one reasoning rule being stored with respect to a characteristic parameter determined on the basis of a plurality of mark signals;
- reasoning means for executing fuzzy reasoning using the mark signal obtained by said mark detecting means on the basis of one of the reasoning rules and the characteristic parameter;
- means for changing the reasoning rule used by said reasoning means, wherein said reasoning means also executes fuzzy reasoning on the basis of the changed reasoning rule;
- positioning means for positioning the wafer on the basis of the fuzzy reasoning using at least one of: the one of the reasoning rules and the changed reasoning rule; and
- transfer means for transferring the pattern of the mask onto the positioned wafer.

40. A semiconductor device manufacturing method, comprising the steps of:
- storing, in memory means, a plurality of reasoning rules, one reasoning rule being stored with respect to a characteristic parameter determined on the basis of a plurality of mark signals;
- detecting a mark of the wafer with mark detecting means to obtain a mark signal;
- executing fuzzy reasoning using the mark obtained by said detecting step on the basis of one of the reasoning rules and the characteristic parameter and changing the reasoning rule used in said executing step so that fuzzy reasoning is also executed on the basis of the changed reasoning rule;
- positioning the wafer on the basis of the fuzzy reasoning using at least one of: the one of the reasoning rule and the changed reasoning rule; and
- printing a semiconductor device pattern on a photosensitive material applied to the wafer.

41. A method according to claim 40, wherein the characteristic parameter determined on the basis of a plurality of mark signals is related to at least one of the wave height difference, the spacing, and the symmetry of the mark signals.

42. A method according to claim 40, wherein said method further comprises the step of preparing an additional reasoning rule with respect to the characteristic parameter corresponding to the at least one reasoning rule, and wherein said executing step comprises the step of selecting one of the at least one reasoning rule and the additional reasoning rule.

43. A method of detecting the position of a mark comprising the steps of:
storing, in memory means, a plurality of reasoning rules, one reasoning rule being stored with respect to a characteristic parameter determined on the basis of an ambience condition of mark detecting means;
detecting the mark with mark detecting means to obtain a mark signal;
executing fuzzy reasoning using the mark signal obtained in said detecting step on the basis of one of the reasoning rules stored in said storing step and the characteristic parameter and changing the reasoning rule used in said executing step so that fuzzy reasoning is also executed on the basis of the changed reasoning rule; and
determining the position of the mark on the basis of the fuzzy reasoning executed in said executing step using at least one of: the one of the reasoning rules and the changed reasoning rule.

44. A method according to claim 43, wherein the characteristic parameter determined on the basis of an ambience condition is related to an ambience pressure of the mark detecting means.

45. A method according to claim 43, wherein said method further comprises the step of preparing an additional reasoning rule with respect to the characteristic parameter and wherein said executing step comprises the step of selecting one of the reasoning rule and the additional reasoning rule.

46. A device for detecting a position of a mark, comprising:
mark detecting means for detecting the mark to obtain a corresponding mark signal;
memory means for storing therein a plurality of reasoning rules, one reasoning rule being stored with respect to a characteristic parameter determined on the basis of an ambience condition of said mark detecting means;
reasoning means for executing fuzzy reasoning using the mark signal obtained by said mark detecting means on the basis of one of the reasoning rules and the characteristic parameter;
means for changing the reasoning rule used by said reasoning means, wherein said reasoning means also executes fuzzy reasoning on the basis of the changed reasoning rule; and
position determining means for determining the position of the mark on the basis of the fuzzy reasoning using at least one of: the one of the reasoning rules and the changed reasoning rule.

47. A device according to claim 46, wherein the characteristic parameter determined on the basis of an ambience condition is related to an ambience pressure of said mark detecting means.

48. A device according to claim 46, wherein said memory means stores an additional reasoning rule prepared with respect to the characteristic parameter, and wherein said reasoning means selects one of the reasoning rule and the additional reasoning rule to execute the fuzzy reasoning.

49. A device according to claim 46, wherein said memory means stores the reasoning rule as a membership function.

50. A positioning device for positioning different zones of a wafer in sequence by using marks provided in relation to the zones, respectively, said device comprising:
mark detecting means for detecting the mark of a particular zone of the wafer to obtain a corresponding mark signal;
memory means for storing therein a plurality of reasoning rules, one reasoning rule being stored with respect to a characteristic parameter determined on the basis of an ambience condition of said positioning device;
positioning means for executing fuzzy reasoning using the mark signal obtained by said mark detecting means on the basis of one of the reasoning rules and the characteristic parameter; and
means for changing the reasoning rule used by said positioning means, wherein said positioning means also executes fuzzy reasoning on the basis of the changed reasoning rule, wherein said positioning means positions the particular zone of the wafer on the basis of the fuzzy reasoning using at least one of: the one of the reasoning rules and the changed reasoning rule.

51. An apparatus for transferring a pattern of a mask onto a wafer, comprising:
mark detecting means for detecting a mark of the wafer to obtain a corresponding mark signal;
memory means for storing therein a plurality of reasoning rules, one reasoning rule being stored with respect to a characteristic parameter determined on the basis of an ambience condition of said mark detecting means;
reasoning means for executing fuzzy reasoning using the mark signal obtained by said mark detecting means on the basis of one of the reasoning rules and the characteristic parameter;
means for changing the reasoning rule used by said reasoning means, wherein said reasoning means also executes fuzzy reasoning on the basis of the changed reasoning rule;
positioning means for positioning the wafer on the basis of the fuzzy reasoning using at least one of: the one of the reasoning rules add the changed reasoning rule; and
transfer means for transferring the pattern of the mask onto the positioned wafer.

52. A semiconductor device manufacturing method, comprising the steps of:
storing, in memory means, a plurality of reasoning rules, one reasoning rule being stored with respect to a characteristic parameter determined on the basis of an ambience condition of mark detecting means;
detecting a mark of the wafer with the mark detecting means to obtain a mark signal;
executing fuzzy reasoning using the mark signal obtained in said detecting step on the basis of one of the reasoning rules and the characteristic parameter and changing the reasoning rule used in said executing step so that fuzzy reasoning is also executed on the basis of the changed reasoning rule;
positioning the wafer on the basis of the fuzzy reasoning using at least one of: the one of the reasoning rules and the changed reasoning rule; and printing a semiconductor device pattern on photosensitive material applied to the wafer.

53. A method according to claim 52, wherein the characteristic parameter determined on the basis of an ambience condition is related to an ambience pressure of the mark detecting means.

54. A method according to claim 52, wherein said method further comprises the step of preparing an additional reasoning rule with respect to the characteristic parameter, and wherein said executing step comprises the step of selecting one of the reasoning rule and the additional reasoning rule.

55. A method of detecting a position of a mark comprising the steps of:
storing, in memory means, a plurality of reasoning rules, one reasoning rule being stored with respect to a characteristic parameter predetermined on the basis of the position of the mark with respect to a coordinate;
detecting the mark with mark detecting means to obtain a mark signal;
executing fuzzy reasoning using the mark obtained in said detecting step on the basis of one of the reasoning rules stored in said storing step and the characteristic parameter and changing the reasoning rule used in said executing step so that fuzzy reasoning is also executed on the basis of the changed reasoning rule; and
determining the position of the mark on the basis of the fuzzy reasoning executed in said executing step using at least one of: the one of the reasoning rules and the changed reasoning rule.

56. A method according to claim 55, wherein said method further comprises the step of preparing an additional reasoning rule with respect to the characteristic parameter corresponding to the reasoning rule and wherein said executing step comprises the step of selecting one of the reasoning rule and the additional reasoning rule.

57. A device for detecting a position of a mark on an object, comprising:
mark detecting means for detecting the mark to obtain a corresponding mark signal;
memory means for storing therein a plurality of reasoning rules, one reasoning rule being stored with respect to a characteristic parameter determined on the basis of the position of the mark on the object with respect to a co-ordinate set in relation to the object;
reasoning means for executing fuzzy reasoning on the basis of one of the reasoning rules and the characteristic parameter;
means for changing the reasoning rule used by said reasoning means, wherein said reasoning means also executes fuzzy reasoning on the basis of the changed reasoning rule; and
position determining means for determining the position of the mark on the basis of the fuzzy reasoning using at least one of: the one of the reasoning rules and the changed reasoning rule.

58. A device according to claim 57, wherein said memory means stores an additional reasoning rule prepared with respect to the characteristics parameter and wherein said reasoning means selects one of the reasoning rule and the additional reasoning rule to execute the fuzzy reasoning.

59. A device according to claim 57, wherein said memory means stores the reasoning rule as a membership function.

60. A positioning device for positioning different zones of a wafer in sequence by using marks provided in relation to the zones, respectively, said device comprising:
mark detecting means for detecting the mark of a particular zone of the wafer to obtain a corresponding mark signal;
memory means for storing therein a plurality of reasoning rule, one reasoning rule being stored with respect to a characteristic parameter determined on the basis of a position of the particular zone on the wafer with respect to a co-ordinate;
positioning means for executing fuzzy reasoning using the mark signal obtained by said detecting means on the basis of one of the reasoning rules and the characteristic parameter; and
means for changing the reasoning rule used by said positioning means, wherein said positioning means also executes fuzzy reasoning on the basis of the changed reasoning rule, wherein said positioning means positions the particular zone of the wafer on the basis of the fuzzy reasoning using at least one of: the one of the reasoning rules and the changed reasoning rule.

61. An apparatus for transferring a pattern of a mask onto a wafer, comprising:
mark detecting means for detecting a mark of the wafer to obtain a corresponding mark signal;
memory means for storing therein a plurality of reasoning rules, one reasoning rule being stored with respect to a characteristic parameter determined on the basis of the position of the mark on the wafer with respect to a co-ordinate;
reasoning means for executing fuzzy reasoning using the mark signal obtained by said mark detecting means on the basis of one of the reasoning rules and the characteristic parameter;
means for changing the reasoning rule used by said reasoning means, wherein said reasoning means also executes fuzzy reasoning on the basis of the changed reasoning rule;
positioning means for positioning the wafer on the basis of the fuzzy reasoning using at least one of: the one of the reasoning rules and the changed reasoning rule; and
transfer means for transferring the pattern of the mask onto the positioned wafer.

62. A semiconductor device manufacturing method, comprising the steps of:
storing, in memory means, a plurality of reasoning rules, one reasoning rule being stored with respect to a characteristic parameter determined on the basis of the position of a mark on the wafer with respect to a coordinate;
detecting a mark of the wafer with mark detecting means to obtain a mark signal;
executing fuzzy reasoning using the mark signal obtained in said detecting step on the basis of one of the reasoning rules and the characteristic parameter corresponding and changing the reasoning rule used in said executing step so that fuzzy reasoning is also executed on the basis of the changed reasoning rule;

positioning the wafer on the basis of the fuzzy reasoning using at least one of: the one of the reasoning rules and the changed reasoning rule; and printing a semiconductor device pattern on a photosensitive material applied to the wafer.

63. A method according to claim 62, wherein, with said method further comprises the step of preparing an additional reasoning rule with respect to the characteristic parameter and wherein said executing step comprises the step of selecting one of the reasoning rule and the additional reasoning rule.

* * * * *

UNITED STATES PATENT AND TRADEMARK OFFICE
CERTIFICATE OF CORRECTION

PATENT NO. : 5,392,361
DATED : February 21, 1995
INVENTOR(S) : MASAAKI IMAIZUMI, et al.

It is certified that error appears in the above-indentified patent and that said Letters Patent is hereby corrected as shown below:

COLUMN 1

Line 63, "FIG. 7, (A)-(G), and FIG. 8, (A)-(G)," should read --FIGS. 7(A)-(G), and FIGS. 8(A)-(G)--.

Line 66, "FIG. 9, (A)-(E), is an" should read --FIGS. 9(A)-9(E) are--; and "view" should read --views--.

COLUMN 2

Figure 10A:
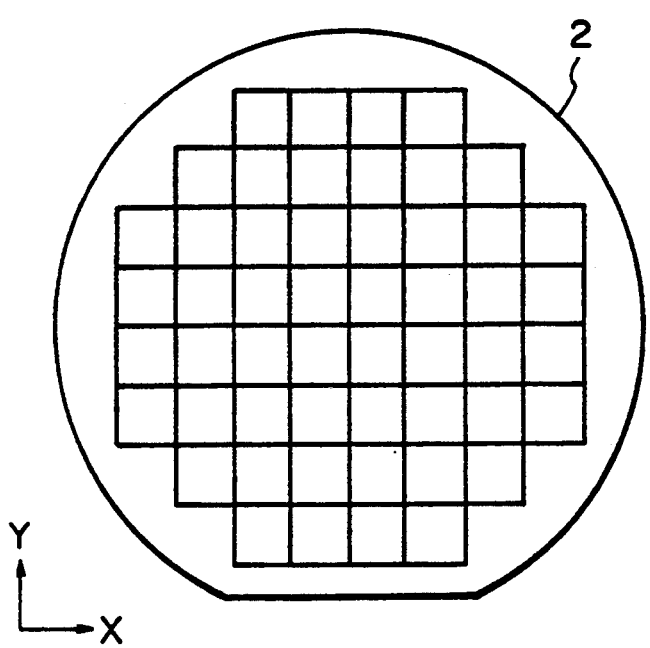
FIG. 10, (A)–(C), is a schematic view illustrating shot layout on a wafer and membership functions in X and Y directions.
Figure 10C:
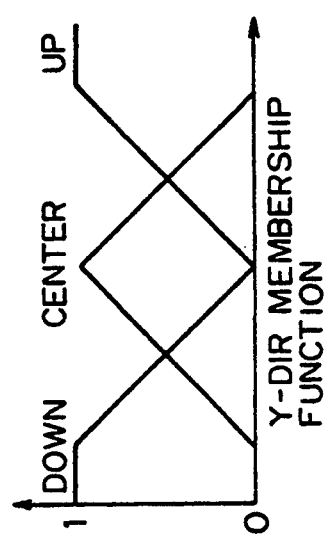
Figure 10B:
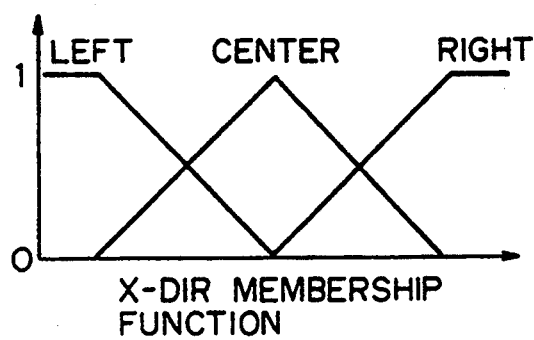

Line 1, "FIG. 10, (A)-(C), is a" should read --FIGS. 10(A)-10(C) are--; and "view illustrating" should read --views illustrating the--.

Figure 11A:
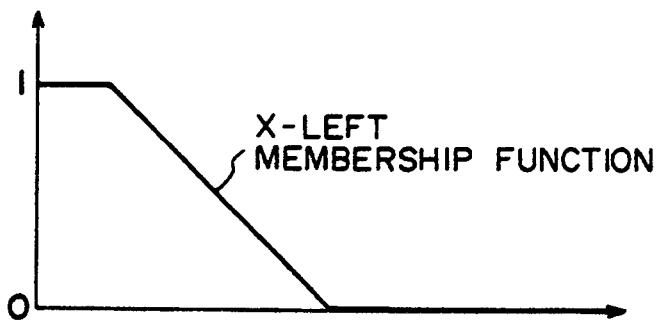
FIG. 11, (A)–(C), FIG. 12, (A)–(C), and FIG. 13, (A)–(C), are representations illustrating membership functions usable in the second embodiment of the present invention.
Figure 11B:
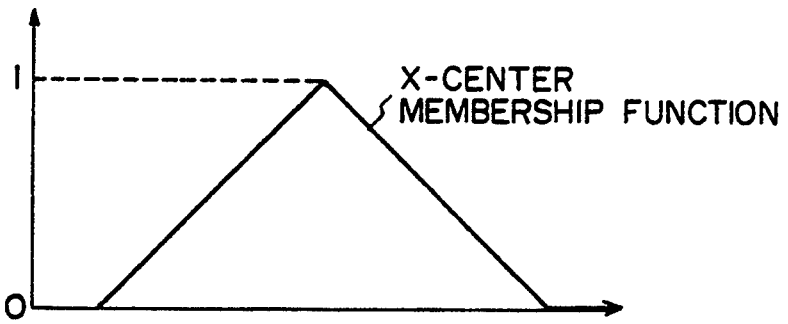
Figure 11C:
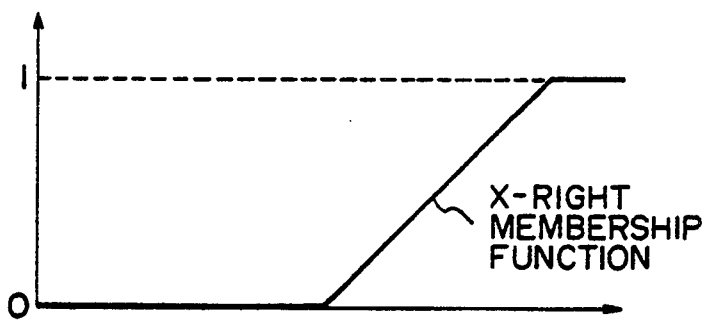
Figure 12A:
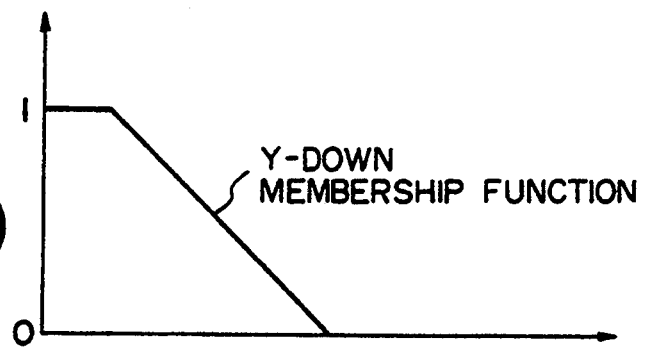
Figure 12B:
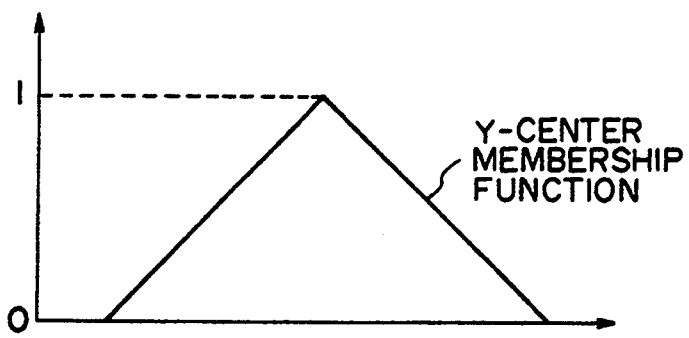
Figure 12C:
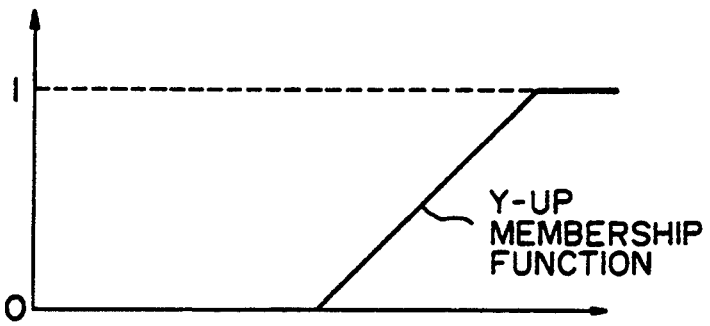

Line 4, "FIG. 11, (A)-(C), FIG. 12, (A)-(C), and FIG. 13" should read --FIGS. 11(A)-11(C), 12(A)-12(C), and 13(A)-13(C)--.

Line 5, "(A)-(C)," should be deleted.

Line 8, "FIG. 14, (A)-(G), and FIG. 15, (A)-(G)," should read --FIGS. 14(A)-14(G) and 15(A)-15(G)--.

Figure 17A:
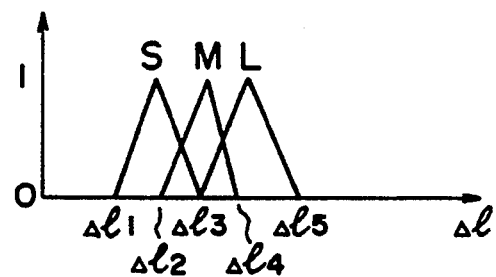

Line 12, "FIG. 16, (A)-(D), and FIG. 17, (A)-(D)," should read --FIGS. 16(A)-16(D), and FIG. 17(A)-17(D)--.

Figure 18A:
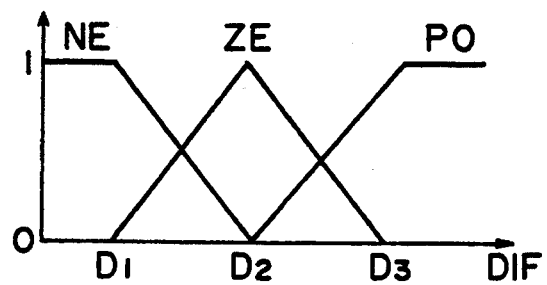
FIG. 18, (A)–(D), and FIG. 19, (A)–(D), are representations illustrating membership functions usable in a method according to a sixth embodiment of the present invention.

Line 16, "FIG. 18, (A)-(D), and FIG. 19, (A)-(D)," should read --FIGS. 18(A)-18(D) and 19(A)-19(D)--.

Figure 29A:
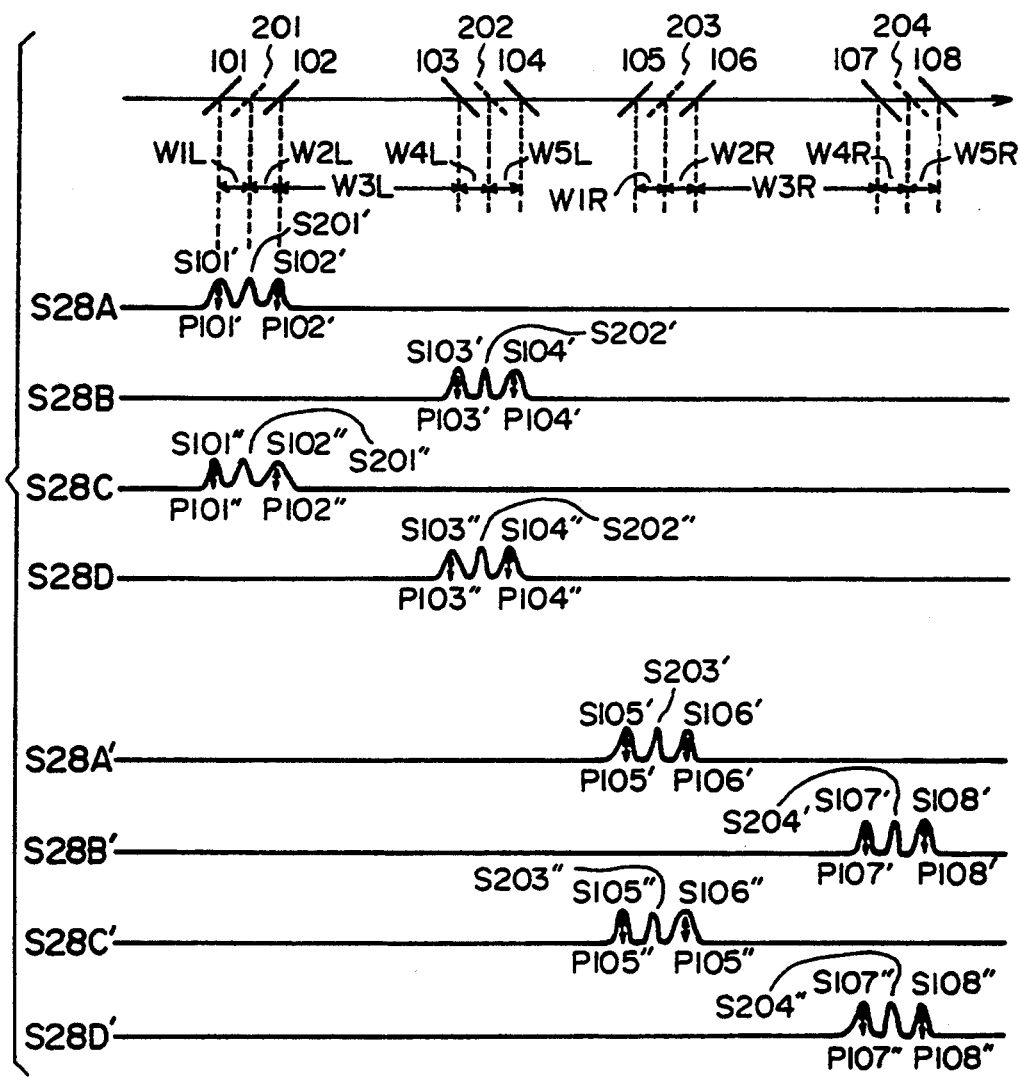
FIGS. 29a–c represent waveforms of various signals as produced by constituent members of the signal processing system shown in FIG. 26.
Figure 29B:
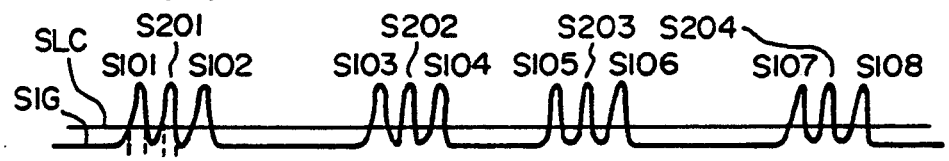
Figure 29C:
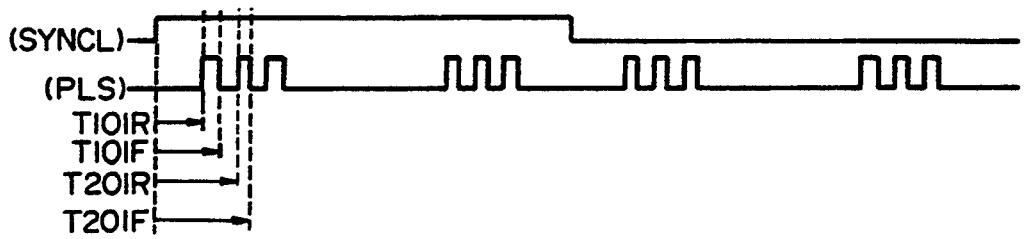
Figure 30:
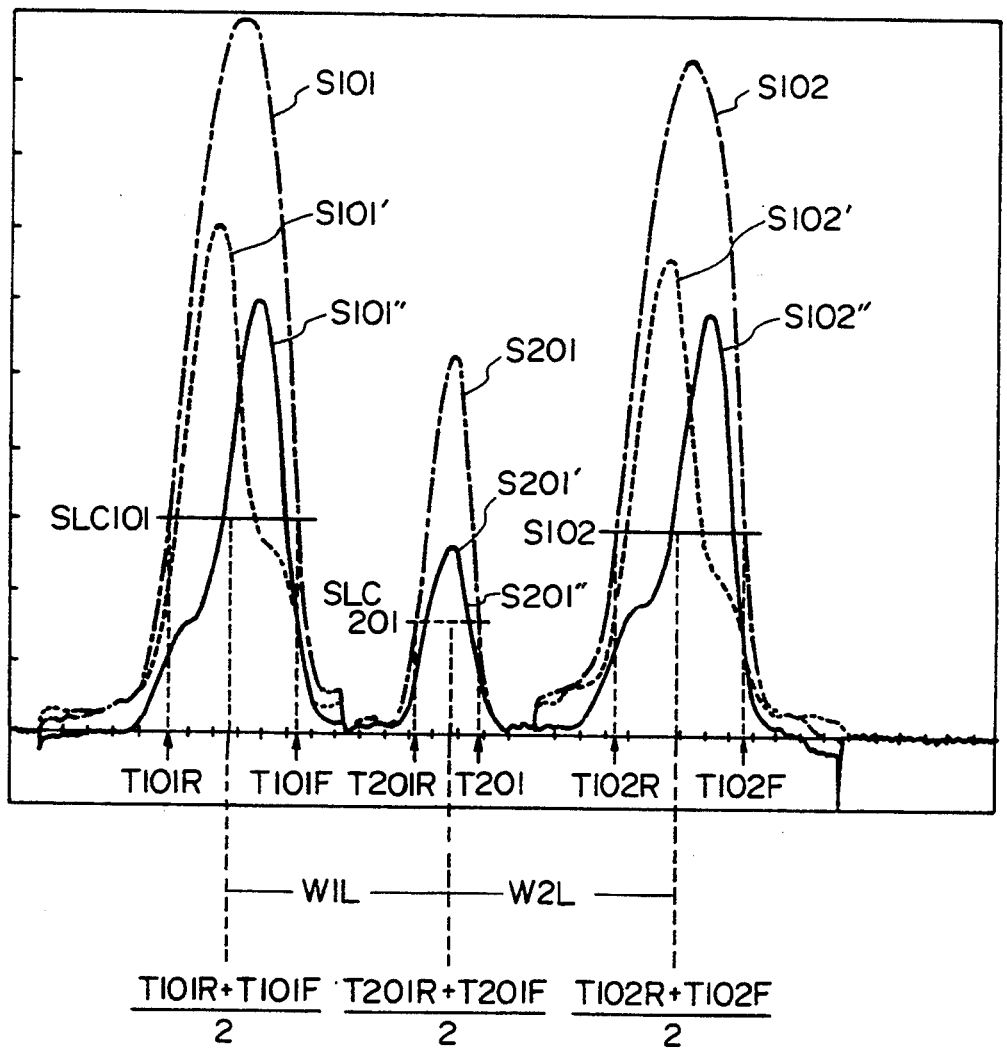
FIG. 30 is a signal waveform view exemplifying alignment signals corresponding to alignment marks.

Line 44, "FIGS. 29 a-c" should read --FIGS. 29(A)-29(C)--.

UNITED STATES PATENT AND TRADEMARK OFFICE
CERTIFICATE OF CORRECTION

PATENT NO. : 5,392,361
DATED : February 21, 1995
INVENTOR(S) : MASAAKI IMAIZUMI, et al.

It is certified that error appears in the above-indentified patent and that said Letters Patent is hereby corrected as shown below:

COLUMN 4

Line 64, "FIG. 29 is a" should read --FIGS. 29(A)-29(C) are--; and "representation" should read --representations--.

COLUMN 5

Line 1, "FIG. 29" should read --FIGS. 29(A)-29(C)--.
Line 5, "FIG. 29" should read --FIGS. 29(A)-29(C)--.
Line 13, "part (B) of" should be deleted.
Line 14, "29" should read --29(B)--.
Line 39, "part (C) of FIG. 29" should read --FIG. 29(C),--.
Line 49, "part (C)" should be deleted.
Line 50, "of FIG. 29," should read --FIG. 29(C)--.
Line 61, "part (A) of FIG. 29," should read --FIG. 29(A),--.

COLUMN 6

Line 22, "FIG. 29" should read --FIG. 29(A)--.
Line 46, "part (A) of FIG. 29" should read --FIG. 29(A)--.
Line 48, "part (B) of FIG. 29" should read --FIG. 29(B)--.
Line 56, "FIG. 29" should read --FIG. 29(A)--.

UNITED STATES PATENT AND TRADEMARK OFFICE
CERTIFICATE OF CORRECTION

PATENT NO. : 5,392,361  Page 3 of 7
DATED : February 21, 1995
INVENTOR(S) : MASAAKI IMAIZUMI, et al.

It is certified that error appears in the above-indentified patent and that said Letters Patent is hereby corrected as shown below:

COLUMN 7

Line 14, "FIG. 29" should read --FIG. 29(B)--.
    Line 18, "FIG. 29" should read --FIG. 29(B)--.
    Line 23, "29" should read --29(B)--.
    Line 60, "part (A) of FIG. 29" should read --FIG. 29(A)--.

COLUMN 8

Line 3, "part (A) of FIG. 29" should read --FIG. 29(A)--.
    Line 25, "R105 = P105''-P105''" should read --R105 = P105'-P105''--.
    Line 28, "R106 = P106''-P106''" should read --R106 = P106'-P106''--.
    Line 30, "R107 = P107''-P107''" should read --R107 = P107'-P107''--.
    Line 32, "R108 = P108''-P108''" should read --R108 = P108'-P108''--.

COLUMN 9

Line 45, "FIG. 7, (A)-(G), and FIG." should read --FIGS. 7(A)-7(G)--.
    Line 46, "8, (A)-(G)" should read --FIGS. 8(A)-8(G)--.
    Line 47, "FIG. 7" should read --FIGS. 7(A)-7(G)--.
    Line 49, "FIG. 7" should read --FIGS. 7(A)-7(G)--.
    Line 51, "FIG. 7" should read --FIGS. 7(A)-7(G)--.
    Line 54, "part (D) of FIG. 7" should read --FIG. 7(D)--.

UNITED STATES PATENT AND TRADEMARK OFFICE
CERTIFICATE OF CORRECTION

PATENT NO. : 5,392,361  Page 4 of 7
DATED : February 21, 1995
INVENTOR(S) : MASAAKI IMAIZUMI, et al.

It is certified that error appears in the above-indentified patent and that said Letters Patent is hereby corrected as shown below:

Line 58, "parts" should be deleted.
Line 59, "(A), (B), (C), (E), (F), and (G) of FIG. 7" should read --FIGS. 7(A)-7(G)--.
Line 61, "parts (A)-(G) of FIG. 8" should read --FIGS. 8(A)-8(G)--.

COLUMN 10

Line 1, "parts (A)-(G) of FIG 7" should read --FIGS. 7(A)-7(G)--; and "parts" should be deleted.
Line 2, "(A)-(G) of FIG. 8" should read --FIGS. 8(A)-8(G)--.
Line 3, "FIG. 9, (A)-(E), is an" should read --FIGS. 9(A)-9(E) are--; and "view" should read --views--.
Line 26, "FIG. 9, (A)" should read --FIG. 9(A)--.
Line 27, "FIG. 9, (B)," should read --FIG. 9(B)--.
Line 30, "part (B) of FIG. 9)" should read --FIG. 9(B))--.
Line 35, "FIG. 9, (C)." should read --FIG. 9(C).--; and "part" should be deleted.
Line 36, "(D) of FIG. 9," should read --FIG. 9(D),--.
Line 39, "part (D) of FIG. 9)." should read --FIG. 9(D)).--.
Line 44, "part (B) of" should be deleted.
Line 45, "FIG. 9" should read --FIG. 9(B)--; and "part" should be deleted.
Line 46, "(D) of FIG. 9" should read --Fig. 9(D)--.
Line 55, "FIG. 9, (E)," should read --FIG. 9(E)--.

UNITED STATES PATENT AND TRADEMARK OFFICE
CERTIFICATE OF CORRECTION

PATENT NO. : 5,392,361
DATED : February 21, 1995
INVENTOR(S) : MASAAKI IMAIZUMI, et al.

It is certified that error appears in the above-indentified patent and that said Letters Patent is hereby corrected as shown below:

COLUMN 11

Line 11, "FIG. 29," should read --FIGS. 29(A)-29(C),--.
    Line 31, "W2L = [(201R + T201F)/2 + ΔT102] - (T102R + T10-" should read
    --W2L = [(201R + T201F)/2 + ΔT102] - [(T102R + T10- --.

COLUMN 12

Line 1, "FIG. 10, (A)," should read --FIG. 10(A),--.
    Line 34, "(FIG. 10, (A))" should read --(FIG. 10(A))--.
    Line 66, "FIG." should read --FIGS.--.
    Line 67, should read --11(A)-11(C); FIGS. 12(A)-12(C); and FIGS. 13(A)-13(C)--.
    Line 68, "Parts (B) and (C) of FIG. 10" should read --FIGS. 10(B) and 10(C)--.

COLUMN 13

Line 64, "fourth" should read --forth--.
    Line 65, "Specification." should read --specification.--.

COLUMN 14

Line 18, "a desired," should read --a desired accuracy,--.

UNITED STATES PATENT AND TRADEMARK OFFICE
CERTIFICATE OF CORRECTION

PATENT NO. : 5,392,361
DATED : February 21, 1995
INVENTOR(S) : MASAAKI IMAIZUMI, et al.

It is certified that error appears in the above-indentified patent and that said Letters Patent is hereby corrected as shown below:

Line 42, "FIG. 14, (A)-(G), and FIG. 15, (A)-(G)." should read --FIGS. 14(A)-14(G) and FIGS. 15(A)-15(G).--.
    Line 64, "specification a," should read --specification, a--.

COLUMN 15

Line 21, "FIG. 16, (A)-(D)," should read --FIGS. 16(A)-16(D)--.
    Line 22, "FIG. 17, (A)-(D)." should read --FIGS. 17(A)-17(D)--.

COLUMN 16

Line 6, "FIG. 18," should read --FIGS. 18(A)-18(D),--.
    Line 7, "(A)-(D)" should be deleted; and "FIG. 19, (A) -(D)." should read --FIGS. 19(A)-19(D).--.
    Line 21, "Specification." should read --specification.--.
    Line 31, "grad 102" should read --grad102--.
    Line 62 should read --in FIGS. 18(A)-18(D), and FIGS. 19(A)-19(D)--.

COLUMN 24

Line 61, "rule" (first occurrence) should read --rules--.

UNITED STATES PATENT AND TRADEMARK OFFICE
CERTIFICATE OF CORRECTION

PATENT NO. : 5,392,361
DATED : February 21, 1995
INVENTOR(S) : MASAAKI IMAIZUMI, et al.

It is certified that error appears in the above-indentified patent and that said Letters Patent is hereby corrected as shown below:

COLUMN 26

Line 47, "add" should read --and--.

COLUMN 27

Line 65, "characteristics" should read --characteristic--.

COLUMN 29

Line 6, "with" should be deleted.

Signed and Sealed this

Eighteenth Day of July, 1995

Attest:

BRUCE LEHMAN

*Attesting Officer*     *Commissioner of Patents and Trademarks*